(12) United States Patent
Nakao

(10) Patent No.: US 6,509,857 B1
(45) Date of Patent: Jan. 21, 2003

(54) DIGITAL-TO-ANALOG CONVERTING METHOD AND DIGITAL-TO-ANALOG CONVERTER

(75) Inventor: Shigetoshi Nakao, Atsugi (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/695,127

(22) Filed: Oct. 24, 2000

(30) Foreign Application Priority Data

Oct. 25, 1999 (JP) .......................................... 11-303061

(51) Int. Cl.[7] .............................................. H03M 1/80
(52) U.S. Cl. ........................ 341/153; 341/121; 341/141; 341/143; 341/144; 341/154
(58) Field of Search ................................ 341/121, 141, 341/143, 144, 158, 154

(56) References Cited

U.S. PATENT DOCUMENTS

| | | | | |
|---|---|---|---|---|
| 4,746,903 A | * | 5/1988 | Czarniak et al. ............. | 341/144 |
| 5,043,730 A | * | 8/1991 | Obinata ....................... | 323/280 |
| 5,539,405 A | * | 7/1996 | Norsworthy ................ | 341/153 |
| 5,585,795 A | * | 12/1996 | Yuasa et al. ................. | 341/118 |
| 5,663,728 A | * | 9/1997 | Essenwanger ............... | 341/153 |
| 5,760,726 A | * | 6/1998 | Koifman et al. ............. | 341/144 |
| 6,163,283 A | * | 12/2000 | Schofield ..................... | 341/50 |
| 6,204,788 B1 | * | 3/2001 | Tani ............................ | 341/144 |
| 6,236,346 B1 | * | 5/2001 | Schofield .................... | 341/144 |

FOREIGN PATENT DOCUMENTS

| JP | 57-48827 | 3/1982 |
|---|---|---|
| JP | 204527 | 8/1989 |

* cited by examiner

*Primary Examiner*—Michael Tokar
*Assistant Examiner*—Khai Nguyen
(74) *Attorney, Agent, or Firm*—W. Daniel Swayze, Jr.; W. James Brady; Frederick J. Telecky, Jr.

(57) ABSTRACT

A digital-to-analog (D/A) converter with a required accuracy can be implemented in a smaller chip area and at a lower cost. The D/A converter comprises a decoder which receives a digital input signal comprised of a first number of bits, and divides the first number of bits into a second number of bit groups. Bit group converters equal in number to the second number, are provided for the second number of bit groups, and each selects and uses a form of weight for each of the bit groups associated therewith to convert the bit group into an analog form in response to the second number of bit groups, thereby generating the second number of bit group analog outputs. An adder adds the second number of the bit group analog outputs to form an analog signal output representative of the digital signal input.

59 Claims, 24 Drawing Sheets

Fig. 2

WHEN 16 LEVELS (= 4 BITS) ARE EXPRESSED BY TWO FORMS OF WEIGHT (X4, X1)

| LEVEL | X4 | X1 |
|---|---|---|
| 15 | ● ● ● | ● ● ● |
| 14 | ● ● ● | ○ ● ● |
| 13 | ● ● ● | ○ ○ ● |
| 12 | ● ● ● | ○ ○ ○ |
| 11 | ○ ● ● | ● ● ● |
| 10 | ○ ● ● | ○ ● ● |
| 9 | ○ ● ● | ○ ○ ● |
| 8 | ○ ● ● | ○ ○ ○ |
| 7 | ○ ○ ● | ● ● ● |
| 6 | ○ ○ ● | ○ ● ● |
| 5 | ○ ○ ● | ○ ○ ● |
| 4 | ○ ○ ● | ○ ○ ○ |
| 3 | ○ ○ ○ | ● ● ● |
| 2 | ○ ○ ○ | ○ ● ● |
| 1 | ○ ○ ○ | ○ ○ ● |
| 0 | ○ ○ ○ | ○ ○ ○ |

Fig. 3

WHEN DIVIDED INTO TWO

| NUMBER OF EXPRESSED BITS | NUMBER OF BITS IN UPPER BIT GROUP | NUMBER OF BITS IN LOWER BIT GROUP | NUMBER OF ELEMENTS IN UPPER BIT GROUP | NUMBER OF ELEMENTS IN LOWER BIT GROUP | TOTAL |
|---|---|---|---|---|---|
| 3 | 2 | 1 | 3 | 1 | 4 |
|   | 1 | 2 | 1 | 3 | 4 |
| 4 | 3 | 1 | 7 | 1 | 8 |
|   | 2 | 2 | 3 | 3 | 6 |
|   | 1 | 3 | 1 | 7 | 8 |
| 5 | 4 | 1 | 15 | 1 | 16 |
|   | 3 | 2 | 7 | 3 | 10 |
|   | 2 | 3 | 3 | 7 | 10 |
|   | 1 | 4 | 1 | 15 | 16 |
| 6 | 5 | 1 | 31 | 1 | 32 |
|   | 4 | 2 | 15 | 3 | 18 |
|   | 3 | 3 | 7 | 7 | 14 |
|   | 2 | 4 | 3 | 15 | 18 |
|   | 1 | 5 | 1 | 31 | 32 |
| 7 | 6 | 1 | 63 | 1 | 64 |
|   | 5 | 2 | 31 | 3 | 34 |
|   | 4 | 3 | 15 | 7 | 22 |
|   | 3 | 4 | 7 | 15 | 22 |
|   | 2 | 5 | 3 | 31 | 34 |
|   | 1 | 6 | 1 | 63 | 64 |
| 8 | 7 | 1 | 127 | 1 | 128 |
|   | 6 | 2 | 63 | 3 | 66 |
|   | 5 | 3 | 31 | 7 | 38 |
|   | 4 | 4 | 15 | 15 | 30 |
|   | 3 | 5 | 7 | 31 | 38 |
|   | 2 | 6 | 3 | 63 | 66 |
|   | 1 | 7 | 1 | 127 | 128 |

Fig. 4 (PRIOR ART)

| NUMBER OF EXPRESSED BITS | TOTAL NUMBER OF ELEMENTS |
|---|---|
| 3 | 7 |
| 4 | 15 |
| 5 | 31 |
| 6 | 63 |
| 7 | 127 |
| 8 | 255 |

Fig. 6

TECHNIQUE OF THE PRESENT INVENTION FOR EXPRESSING 16 LEVELS (= 4 BITS) BY TWO FORMS OF WEIGHT (X4, X1)

Fig. 8(a)

| INPUT DATA SEQUENCE | a1 | a2 | a3 | a4 | |
|---|---|---|---|---|---|
| PATTERN | ①②③④ | ①②③④ | ①②③④ | ①②③④ | |

Fig. 8(b)

| INPUT DATA SEQUENCE | a1 | a2 | |
|---|---|---|---|
| PATTERN | ①②③④①②③④ | ①②③④①②③④ | |

Fig. 8(c)

| INPUT DATA SEQUENCE | a1 | a2 | a3 | a4 | a5 | a6 | a7 | a8 | a9 |
|---|---|---|---|---|---|---|---|---|---|
| PATTERN | ① | ② | ③ | ④ | ① | ② | ③ | ④ | ① |

Fig. 8(d)

| INPUT DATA SEQUENCE | a1 | a2 | a3 | a4 | a5 | a6 | a7 | a8 | a9 |
|---|---|---|---|---|---|---|---|---|---|
| PATTERN | ① | ① | ② | ② | ③ | ③ | ④ | ④ | ① |

Fig. 9  IMPLEMENTATION OF THE PRESENT INVENTION IN DIVISION BY TWO

| NUMBER OF EXPRESSED BITS | NUMBER OF BITS IN UPPER BIT GROUP | NUMBER OF BITS IN LOWER BIT GROUP | NUMBER OF ELEMENTS IN UPPER BIT GROUP | NUMBER OF ELEMENTS IN LOWER BIT GROUP | TOTAL |
|---|---|---|---|---|---|
| 3 | 2 | 1 | 4 | 2 | 6 |
|   | 1 | 2 | 2 | 6 | 8 |
| 4 | 3 | 1 | 8 | 2 | 10 |
|   | 2 | 2 | 4 | 6 | 10 |
|   | 1 | 3 | 2 | 14 | 16 |
| 5 | 4 | 1 | 16 | 2 | 18 |
|   | 3 | 2 | 8 | 6 | 14 |
|   | 2 | 3 | 4 | 14 | 18 |
|   | 1 | 4 | 2 | 30 | 32 |
| 6 | 5 | 1 | 32 | 2 | 34 |
|   | 4 | 2 | 16 | 6 | 22 |
|   | 3 | 3 | 8 | 14 | 22 |
|   | 2 | 4 | 4 | 30 | 34 |
|   | 1 | 5 | 2 | 62 | 64 |
| 7 | 6 | 1 | 64 | 2 | 66 |
|   | 5 | 2 | 32 | 6 | 38 |
|   | 4 | 3 | 16 | 14 | 30 |
|   | 3 | 4 | 8 | 30 | 38 |
|   | 2 | 5 | 4 | 62 | 66 |
|   | 1 | 6 | 2 | 126 | 128 |
| 8 | 7 | 1 | 128 | 2 | 130 |
|   | 6 | 2 | 64 | 6 | 70 |
|   | 5 | 3 | 32 | 14 | 46 |
|   | 4 | 4 | 16 | 30 | 46 |
|   | 3 | 5 | 8 | 62 | 70 |
|   | 2 | 6 | 4 | 126 | 130 |
|   | 1 | 7 | 2 | 254 | 256 |

Fig. 10

IMPLEMENTATION OF THE PRESENT INVENTION IN DIVISION BY THREE

| NUMBER OF EXPRESSED BITS | NUMBER OF BITS IN UPPER BIT GROUP | NUMBER OF BITS IN MIDDLE BIT GROUP | NUMBER OF BITS IN LOWER BIT GROUP | NUMBER OF ELEMENTS IN UPPER BIT GROUP | NUMBER OF ELEMENTS IN MIDDLE BIT GROUP | NUMBER OF ELEMENTS IN LOWER BIT GROUP | TOTAL |
|---|---|---|---|---|---|---|---|
| 3 | 1 | 1 | 1 | 2 | 2 | 2 | 6 |
| 4 | 2 | 1 | 1 | 4 | 2 | 2 | 8 |
| 5 | 2 | 2 | 1 | 4 | 6 | 2 | 12 |
| 5 | 3 | 1 | 1 | 8 | 2 | 2 | 12 |
| 6 | 2 | 2 | 2 | 4 | 6 | 2 | 12 |
| 6 | 2 | 2 | 2 | 4 | 6 | 6 | 16 |
| 7 | 3 | 2 | 2 | 8 | 6 | 2 | 16 |
| 7 | 3 | 2 | 2 | 8 | 6 | 6 | 20 |
| 8 | 4 | 2 | 2 | 16 | 6 | 2 | 24 |
| 8 | 2 | 3 | 3 | 4 | 14 | 14 | 32 |
| 8 | 3 | 2 | 2 | 8 | 6 | 6 | 20 |
| 8 | 4 | 2 | 2 | 16 | 6 | 6 | 28 |

Fig. 13

WHEN ± 16 LEVELS (= 5 BITS) ARE EXPRESSED BY TWO FORMS OF WEIGHT (X4, X1) IN SIGN-MAGNITUDE FORMAT

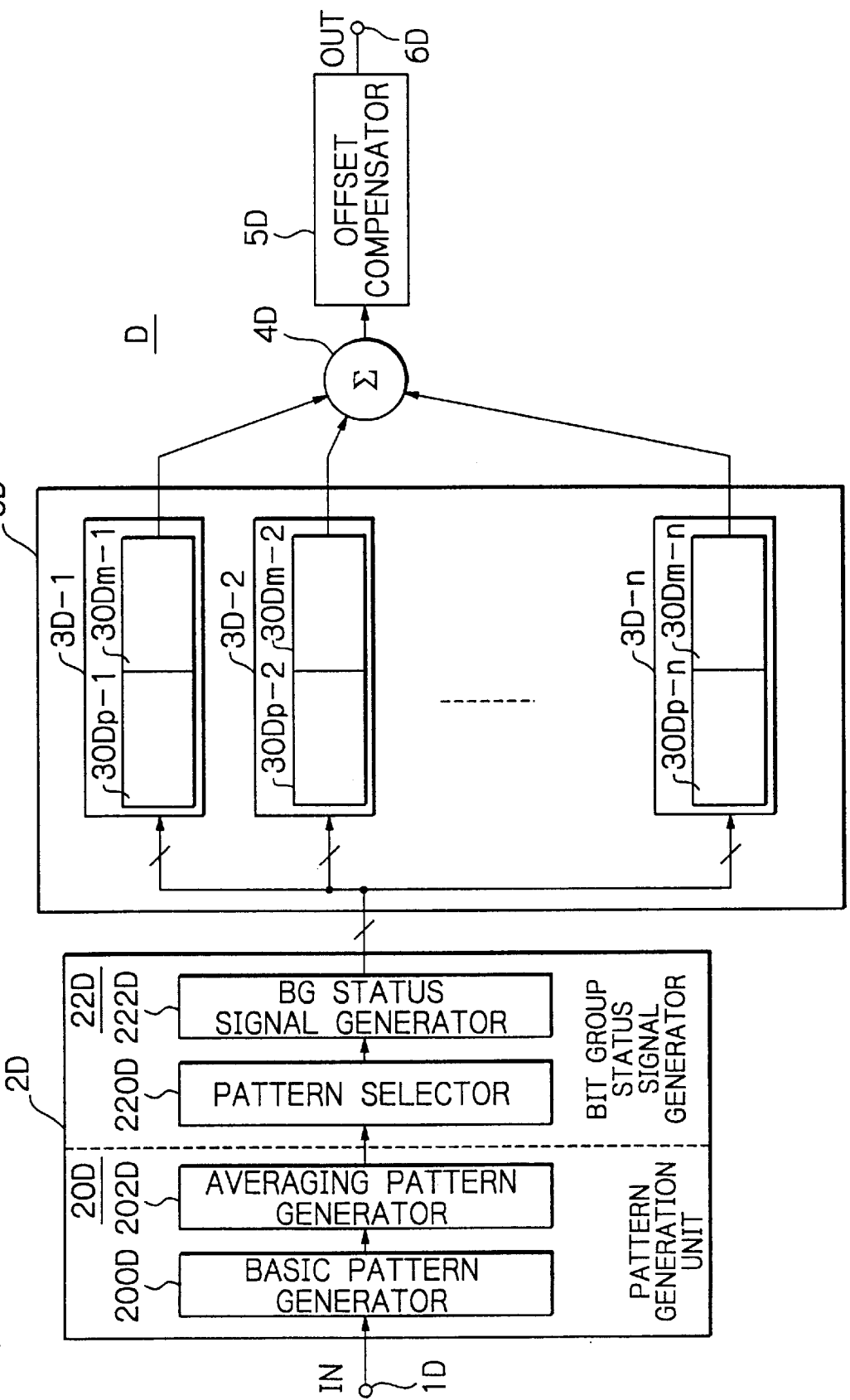

Fig. 16

TECHNIQUE OF THE PRESENT INVENTION FOR EXPRESSING ± 16 LEVELS (=5 BITS) BY TWO FORMS OF WEIGHT (X4, X1) IN SIGN-MAGNITUDE FORMAT

Fig. 17(a)

EXAMPLE OF AVERAGING TECHNIQUE
IN SAME FORMS OF WEIGHT
a0~7: INDICATE EACH X4 WEIGHT ELEMENT
b0~6: INDICATE EACH X1 WEIGHT ELEMENT
—: OFF
◆: ON
INPUT = 5

| LEVEL | X4<br>a7 a6 a5 a4 a3 a2 a1 a0 | X1<br>b6 b5 b4 b3 b2 b1 b0 |
|---|---|---|
| 5 | — — — ◆ ◆ ◆ ◆ ◆ | — — ◆ ◆ ◆ ◆ ◆ |
|   | ◆ ◆ ◆ — — — ◆ ◆ | ◆ ◆ — ◆ ◆ ◆ ◆ |
|   | — ◆ ◆ ◆ ◆ ◆ — — | ◆ ◆ ◆ ◆ ◆ — ◆ |
|   | ◆ — ◆ ◆ ◆ — ◆ — | ◆ — ◆ ◆ ◆ ◆ — |
|   | ◆ ◆ ◆ — ◆ — — ◆ | ◆ — ◆ — ◆ ◆ ◆ |
|   | — ◆ — ◆ ◆ — ◆ ◆ | ◆ ◆ ◆ — ◆ — ◆ |
|   | ◆ ◆ — ◆ — ◆ ◆ — | — ◆ ◆ ◆ — ◆ ◆ |
|   | ◆ ◆ ◆ ◆ — — — ◆ | ◆ — ◆ ◆ ◆ ◆ — |
|   | — — ◆ ◆ ◆ ◆ — — | ◆ ◆ — — ◆ ◆ ◆ |
|   | ◆ ◆ ◆ — — ◆ — ◆ | ◆ ◆ ◆ ◆ — — ◆ |

Fig. 17(b)

VARYING INPUT

| LEVEL | X4<br>a7 a6 a5 a4 a3 a2 a1 a0 | X1<br>b6 b5 b4 b3 b2 b1 b0 |
|---|---|---|
| 5 | — — — ◆ ◆ ◆ ◆ ◆ | — — ◆ ◆ ◆ ◆ ◆ |
| 6 | ◆ ◆ ◆ — — — ◆ ◆ | ◆ ◆ — ◆ ◆ ◆ ◆ |
| -2 | — — ◆ ◆ ◆ — — | — ◆ ◆ — — — ◆ |
| 12 | ◆ ◆ — ◆ ◆ ◆ ◆ ◆ | ◆ — — — ◆ ◆ ◆ |
| 0 | ◆ ◆ ◆ — — — — ◆ | ◆ ◆ ◆ ◆ — — — |
| -15 | — — — — — ◆ — | — — — — — — ◆ |
| -8 | — — ◆ ◆ ◆ — — | — — — — — — — |
| 9 | ◆ ◆ ◆ — — ◆ ◆ ◆ | — ◆ ◆ ◆ ◆ ◆ ◆ |
| 1 | — ◆ — ◆ — — — | ◆ — — ◆ ◆ ◆ — |
| -4 | ◆ — — — — ◆ ◆ ◆ | — — — — — — — |
| 13 | ◆ ◆ ◆ ◆ — ◆ ◆ ◆ | ◆ ◆ ◆ — — ◆ ◆ |
| 5 | — ◆ ◆ ◆ ◆ ◆ — — | ◆ ◆ ◆ ◆ ◆ — — |
| -2 | ◆ — — — — ◆ ◆ ◆ | — — — — — ◆ ◆ |
| -14 | — — — — ◆ — — | — — — ◆ ◆ — |
| -10 | — — ◆ ◆ — — — | — ◆ ◆ — — — — |
| 7 | ◆ ◆ — — — ◆ ◆ ◆ | ◆ ◆ ◆ ◆ ◆ ◆ ◆ |
| 4 | ◆ ◆ ◆ ◆ ◆ — — — | ◆ — — — ◆ ◆ ◆ |
| -5 | — — — — ◆ ◆ ◆ | — ◆ ◆ ◆ — — — |
| 10 | ◆ ◆ ◆ ◆ — ◆ ◆ ◆ | ◆ — ◆ ◆ ◆ ◆ ◆ |
| -7 | — — — — ◆ ◆ ◆ — | — ◆ — — — — — |

Fig. 18

WHEN DIVIDED BY TWO

| NUMBER OF EXPRESSED BITS | NUMBER OF BITS IN UPPER BIT GROUP | NUMBER OF BITS IN LOWER BIT GROUP | NUMBER OF ELEMENTS IN UPPER BIT GROUP | NUMBER OF ELEMENTS IN LOWER BIT GROUP | TOTAL |
|---|---|---|---|---|---|
| 4 | 2 | 1 | 3 | 1 | 9 |
|   | 1 | 2 | 1 | 3 | 9 |
| 5 | 3 | 1 | 7 | 1 | 17 |
|   | 2 | 2 | 3 | 3 | 13 |
|   | 1 | 3 | 1 | 7 | 17 |
| 6 | 4 | 1 | 15 | 1 | 33 |
|   | 3 | 2 | 7 | 3 | 21 |
|   | 2 | 3 | 3 | 7 | 21 |
|   | 1 | 4 | 1 | 15 | 33 |
| 7 | 5 | 1 | 31 | 1 | 65 |
|   | 4 | 2 | 15 | 3 | 37 |
|   | 3 | 3 | 7 | 7 | 29 |
|   | 2 | 4 | 3 | 15 | 37 |
|   | 1 | 5 | 1 | 31 | 65 |
| 8 | 6 | 1 | 63 | 1 | 129 |
|   | 5 | 2 | 31 | 3 | 69 |
|   | 4 | 3 | 15 | 7 | 45 |
|   | 3 | 4 | 7 | 15 | 45 |
|   | 2 | 5 | 3 | 31 | 69 |
|   | 1 | 6 | 1 | 63 | 129 |

Fig. 19 (PRIOR ART)

| NUMBER OF EXPRESSED BITS | TOTAL NUMBER OF ELEMENTS |
|---|---|
| 3 | 7 |
| 4 | 9 |
| 5 | 11 |
| 6 | 13 |
| 7 | 15 |
| 8 | 17 |

Fig. 20 (PRIOR ART)

| NUMBER OF EXPRESSED BITS | TOTAL NUMBER OF ELEMENTS |
|---|---|
| 3 | 7 |
| 4 | 15 |
| 5 | 31 |
| 6 | 63 |
| 7 | 127 |
| 8 | 255 |

Fig. 21

IMPLEMENTATION OF THE PRESENT INVENTION IN DIVISION BY TWO

| NUMBER OF EXPRESSED BITS | NUMBER OF BITS IN UPPER BIT GROUP | NUMBER OF BITS IN LOWER BIT GROUP | NUMBER OF ELEMENTS IN UPPER BIT GROUP | NUMBER OF ELEMENTS IN LOWER BIT GROUP | TOTAL |
|---|---|---|---|---|---|
| 4 | 2 | 1 | 4 | 1 | 11 |
|   | 1 | 2 | 2 | 3 | 11 |
| 5 | 3 | 1 | 8 | 1 | 19 |
|   | 2 | 2 | 4 | 3 | 15 |
|   | 1 | 3 | 2 | 7 | 19 |
| 6 | 4 | 1 | 16 | 1 | 35 |
|   | 3 | 2 | 8 | 3 | 23 |
|   | 2 | 3 | 4 | 7 | 23 |
|   | 1 | 4 | 2 | 15 | 35 |
| 7 | 5 | 1 | 32 | 1 | 67 |
|   | 4 | 2 | 16 | 3 | 39 |
|   | 3 | 3 | 8 | 7 | 31 |
|   | 2 | 4 | 4 | 15 | 39 |
|   | 1 | 5 | 2 | 31 | 67 |
| 8 | 6 | 1 | 64 | 1 | 131 |
|   | 5 | 2 | 32 | 3 | 71 |
|   | 4 | 3 | 16 | 7 | 47 |
|   | 3 | 4 | 8 | 15 | 47 |
|   | 2 | 5 | 4 | 31 | 71 |
|   | 1 | 6 | 2 | 63 | 131 |

Fig. 22 (PRIOR ART)

WHEN 16 LEVELS (= 4 BITS) ARE
EXPRESSED BY FOUR FORMS OF WEIGHT

| LEVEL | X8 | X4 | X2 | X1 |
|---|---|---|---|---|
| 15 | ● | ● | ● | ● |
| 14 | ● | ● | ● | ○ |
| 13 | ● | ● | ○ | ● |
| 12 | ● | ● | ○ | ○ |
| 11 | ● | ○ | ● | ● |
| 10 | ● | ○ | ● | ○ |
| 9 | ● | ○ | ○ | ● |
| 8 | ● | ○ | ○ | ○ |
| 7 | ○ | ● | ● | ● |
| 6 | ○ | ● | ● | ○ |
| 5 | ○ | ● | ○ | ● |
| 4 | ○ | ● | ○ | ○ |
| 3 | ○ | ○ | ● | ● |
| 2 | ○ | ○ | ● | ○ |
| 1 | ○ | ○ | ○ | ● |
| 0 | ○ | ○ | ○ | ○ |

● : ON
○ : OFF

Fig. 23 (PRIOR ART)

WHEN 16 LEVELS (= 4 BITS) ARE
EXPRESSED BY SINGLE FORM OF WEIGHT

Fig. 24 (PRIOR ART)

SIGN-MAGNITUDE FORMAT

| LEVEL | X8 | X4 | X2 | X1 |
|---|---|---|---|---|
| 15  | ●● | ●● | ●● | ●●●|
| 14  | ●● | ●● | ●● | ○●●|
| 13  | ●● | ●● | ●○ | ●●●|
| 12  | ●● | ●● | ●○ | ○●●|
| 11  | ●● | ●○ | ●● | ●●●|
| 10  | ●● | ●○ | ●● | ○●●|
| 9   | ●● | ●○ | ●○ | ●●●|
| 8   | ●● | ●○ | ●○ | ○●●|
| 7   | ○● | ●● | ●● | ●●●|
| 6   | ○● | ●● | ●● | ○●●|
| 5   | ○● | ●● | ●○ | ●●●|
| 4   | ○● | ●● | ●○ | ○●●|
| 3   | ○● | ●○ | ●● | ●●●|
| 2   | ○● | ●○ | ●● | ○●●|
| 1   | ○● | ●○ | ●○ | ●●●|
| 0   | ○● | ●○ | ●○ | ●●●|
| -1  | ○● | ●○ | ●○ | ●●○|
| -2  | ○● | ●○ | ●○ | ○○○|
| -3  | ○● | ●○ | ●○ | ○●○|
| -4  | ○● | ●○ | ●○ | ○○○|
| -5  | ○● | ○○ | ○● | ●●○|
| -6  | ○● | ○○ | ○● | ○○○|
| -7  | ○● | ○○ | ○○ | ●●○|
| -8  | ○● | ○○ | ○○ | ○○○|
| -9  | ○○ | ●○ | ●● | ●●○|
| -10 | ○○ | ●○ | ●● | ○○○|
| -11 | ○○ | ●○ | ●○ | ●●○|
| -12 | ○○ | ●○ | ●○ | ○○○|
| -13 | ○○ | ○○ | ●● | ●●○|
| -14 | ○○ | ○○ | ●○ | ○○○|
| -15 | ○○ | ○○ | ○○ | ●●○|
| -16 | ○○ | ○○ | ○○ | ○○○|

● : ON
○ : OFF

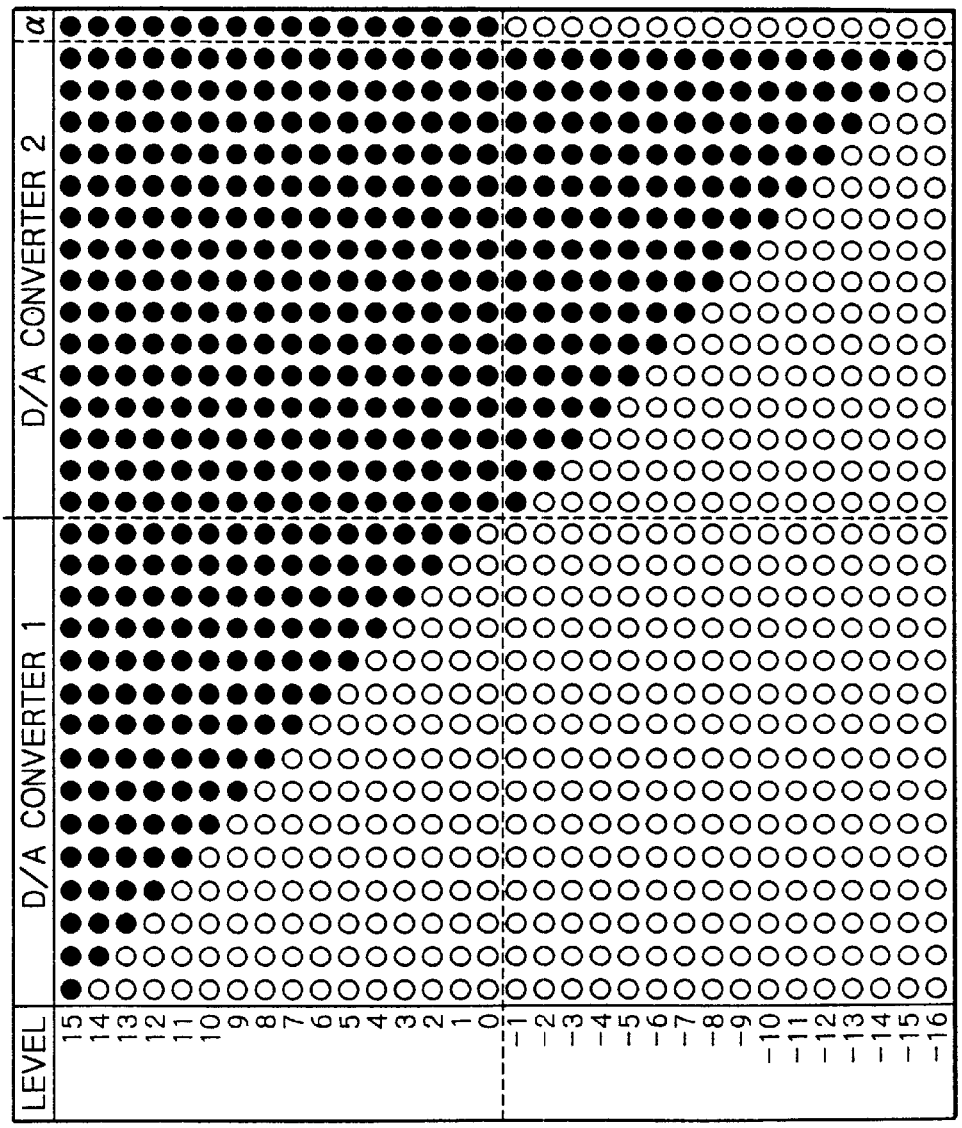
Fig. 25 (PRIOR ART) WHEN ±16 LEVELS (= 5 BITS) ARE EXPRESSED BY SINGLE FORM OF WEIGHT

DIGITAL-TO-ANALOG CONVERTING METHOD AND DIGITAL-TO-ANALOG CONVERTER

BACKGROUND OF THE INVENTION

The present invention relates generally to digital-to-analog (D/A) conversion for converting a digital input signal to an analog output signal, and more particularly, to a D/A converting method and a D/A converter which are capable of facilitating reduction or removal of relative errors among weight generating elements, which are introduced in the course of manufacturing of converters.

Conventionally, as a general conversion scheme for implementing D/A conversion, a so-called multi-bit scheme is known. Referring to FIG. 22, the D/A conversion in accordance with the multi-bit scheme will be described below. For a binary digital signal to be converted to an analog signal, a converting element or a weight generating element is provided for each of digits which constitutes the signal. The respective weight generating elements are designed and manufactured such that their weights have preset values for associated bits. In an example shown in FIG. 22, four binary bits (=16 levels) are expressed by four different forms of weight, i.e., x1, x2, x4, x8 weights. In the D/A conversion in accordance with this scheme, the weight generating elements are controlled ON/OFF in accordance with the binary states of the respective digits of the binary digital signal (a black circle represents ON state, and a white circle represents OFF state) to generate an analog signal represented by the binary digital signal. With the use of this scheme, the total number of the weight generating elements is equal to the number of digits of a binary digital signal or a digital code if the simplest configuration is employed. Thus, a digital-to-analog (D/A) converter of the type mentioned above can be implemented on a relatively small chip area since a required number of elements is small, although respective elements may differ in physical size.

FIG. 23 shows another conventional conversion scheme for D/A conversion which comprises unit weight generating elements such as current sources having an almost equal weight to each other, equal in number to the decimal number represented by a binary digital code. Laid-open Japanese Patent Application No. 204527/89 discloses an example of a digital-to-analog converter in accordance with the configuration as shown. In the example shown in FIG. 23, binary four bits (=16 levels) are expressed by 16 single-weight generating elements, i.e., elements having a form of weight of x1. This type of D/A converter turns on a number of weight generating elements equal to a decimal value represented by a digital code, and sums up analog outputs generated thereby to derive a final analog signal. While the individual unit weight generating elements are less likely to generate errors in their outputs as compared with the first scheme mentioned above, the unit weight generating elements generally have minor errors which may cause nonlinearity appearing in the level of a resulting analog output signal, an increased distortion in an AC output signal, and so on, thereby limiting the analog performance. A technique for solving these troubles has been proposed. Specifically, in a time period in which a given digital code is converted to an analog amount, i.e., in a main period, a combination of used weight generating elements is dynamically changed to average output errors among unit weight generating elements. For combining unit weight generating elements, a variety of methods have been proposed. For example, Laid-open Japanese Patent Applications Nos. 48827/82 and 204527/89 disclose such methods. In either of the methods, however, a multiplicity of unit conversion elements are selected and used to produce a whole analog output level. The total number of unit conversion elements required by such a method for a 4-bit converter, by way of example, amounts to at least 15 ($=2^4-1$). For a 16-bit converter typically employed in the field of PCM audio, however, the number of required unit conversion elements will rise up to as much as 65,535 ($=2^{16}-1$). It will be understood that a D/A converter, if configured in accordance with the foregoing scheme, would require a much larger chip area than that required by the first scheme.

FIGS. 24 and 25 show tables each representing the relationship between respective levels and weight generating elements for expressing the levels in a sign-magnitude format. More specifically, FIG. 24 shows a table relating each level to weight generating elements when the conventional multi-bit scheme in FIG. 22 is used in the sign-magnitude format. As shown, two D/A converters for implementing the conversion in FIG. 22 (each having two weight generating elements for each of x1, x2, x4, x8 weights), and an additional x1 weight generating element for expressing a sign bit are provided. FIG. 25 in turn shows a table relating each level to unit weight generating elements when the conventional conversion scheme of FIG. 23 is used in the sign-magnitude format, wherein two D/A converters for implementing the conversion of FIG. 23 (each having 15 unit weight generating elements), and an additional unit weight generating element for expressing a sign bit (α) are provided.

The prior art schemes described above imply the following shortcomings. Specifically, in the multi-bit scheme or the first conversion scheme, a relative linearity among all weighted conversion elements must be maintained in accordance with a resolution required for a D/A converter. To meet this requirement, a technique called "trimming" has been conventionally used for each of manufactured converters to make adjustments among conversion elements in order to enhance a relative manufacturing accuracy. This technique is extremely expensive for implementing a highly accurate D/A converter.

In the second conversion scheme, on the other hand, the total number of required unit converting elements (weight generating elements) exponentially increases and become immense, as a larger number of digital bits or a more accurate converter is implemented, as has been described in the aforementioned example. This means that a large chip area is required when a D/A converter is implemented in a semiconductor integrated circuit. Furthermore, large variations and so on in a variety of parameters in such a large chip area would increase the cost of a highly accurate D/A converter.

SUMMARY OF THE INVENTION

It is therefore an object of the present invention to provide a method and apparatus which are capable of realizing a digital-to-analog converter having a required accuracy in a smaller chip area.

It is another object of the present invention to provide a method and apparatus which are capable of implementing a required digital-to-analog converter at a lower cost.

It is a further object of the present invention to provide a highly accurate digital-to-analog converter at a lower price.

To achieve the above objects, the present invention provides, in a first aspect, a digital-to-analog converting method for converting a digital signal input comprising a first plural number of bits each having a different weight from a digital form to an analog form. The digital-to-analog converting method comprises the steps of (A) dividing the first number of bits into a second plural number of bit groups, and using one form of weight for each of the bit groups to convert each bit group into an analog form to generate the second number of bit group analog outputs; and (B) forming an analog signal output representative of the digital signal input from the second number of bit group analog outputs.

Also, in the present invention, the same type of digital-to-analog converting scheme may be used for the bit groups. In addition, the first number of bits may or may not include a sign bit.

Further, in the present invention, the step (A) may include the steps of (a) dividing the first number of bits into the second number of bit groups; (b) selecting the one form of weight for use in expressing each bit group of the second number of bit groups; (c) determining a number of weights having said selected form of weight required to express each of the bit groups with the selected form of weight; and (d) using said selected form of weight and the determined number of weights having said selected form of weight to convert said each bit group to said bit group analog outputs. Further, the step (d) may include the steps of (e) determining a third maximum number of weights having the selected form of weight required to express each bit group with the selected form of weight; (f) providing the second number of weight generator groups for the plurality of bit groups by providing a weight generator group comprising the third number of weight generators having a weight corresponding to the selected form of weight for each bit group; and (g) controlling the second number of weight generator groups in response to the second number of bit groups to generate the bit group analog outputs.

Further, in the present invention, as the selected form of weight for use in expressing each bit group in the plurality of bit groups, it is possible to select a weight associated with the least significant bit of each bit group corresponding thereto, or a weight associated with a bit in the first number of bits located at a bit position lower than the least significant bit. In addition, the second number may be equal to or more than two and smaller than the first number.

Further, in the present invention, the third number may be equal to a fourth number which is a minimum number of weights having the selected form of weight required for expressing each bit group with said selected form of weight. Alternatively, the third number may be the sum of a fourth number which is a minimum number of weights having the selected form of weight required for expressing each bit group therewith, and a fifth number used for correcting errors between weight generators in the second number of weight generator groups.

In the case mentioned above, the fifth number may have a value specific to each weight generator group. Then, the step of (g) may include the steps of (h) preparing a sixth plural number of different combination patterns of status signals, representing the status each of all weight generators included in the second number of weight generator group, for use in an analog expression for each of values represented by the digital signal input, wherein the status signal has a first state for causing an associated weight generator to generate a weighted analog output having a weight of the weight generator, and a second state for causing the associated weight generator to generate a weighted analog output without the weight; (i) selecting status signals from the sixth number of different status signal combination patterns within a first period in which a given digital signal input is converted to an analog signal output; (j) controlling the all weight generators using the selected status signals to generate the weighted analog outputs from the all weight generators; and (k) adding the weighted analog outputs generated from the all weight generators to generate an analog signal output corresponding to the given digital signal input. Further, the step (i) may selectively use all of the sixth number of different combination patterns of status signals at least once within the first period. Alternatively, the step of (i) may selectively use all of the sixth number of different combination patterns of status signals at least once within a sequence of a plurality of the first periods, and selectively use a portion of the sixth number of different combination patterns of status signals within each first period of the sequence of the plurality of the first periods. Also, in the present invention, the digital-to-analog converting method may further include the step of canceling a constant offset in the magnitude of the analog signal output. In this event, the constant offset may include only a constant difference from an analog value represented by the digital signal input in the value of the analog signal output.

Also, according to the present invention, the plurality of different weight generators may comprise voltage or current sources each having a weight corresponding to the weight of each of the weight generators. The plurality of different weight generators may comprise voltage or current sources having a weight of a common magnitude, and weighting means for applying each source with a weight of each weight generator. The weighting means may comprise an R-2R ladder circuit.

According to a second aspect, the present invention provides a digital-to-analog converter for converting a digital signal input comprising a first plural number of bits, each having a different weight, from a digital form to an analog form. The digital-to-analog converter comprises decoding means connected to receive a digital signal input for dividing the first number of bits into a second plural number of bit groups; a second number of converting means provided for the second number of bit groups, wherein each of the bit group converting means selectively uses a form of weight for each bit group associated therewith, thereby converting the bit group to the analog form in response to the second number of bit groups to generate the second number of bit group analog outputs; and adding means for adding the second number of bit group analog outputs to form an analog signal output representative of the digital signal input.

In the present invention, the same type of digital-to-analog converting method may be used for the bit groups. The first number of bits may or may not include a sign bit.

Also, in the present invention, each of the bit group converting means may include a weight generator group having a third number of weight generators having a weight corresponding to the selected form of weight for each bit group, wherein the third number is a maximum number of weights having the selected form of weight required to express each bit group therewith. Also, as the selected form of weight for use in expressing each bit group in the plurality of bit groups, a weight associated with the least significant bit of each bit group corresponding thereto, or a weight associated with a bit in the first number of bits located at a bit position lower than the least significant bit is selected.

Further, in the present invention, the second number may be equal to or more than two and smaller than the first number. The third number in turn may be equal to a fourth number which is a minimum number of weights having the selected form of weight required for expressing each bit group therewith.

Alternatively, the third number may be the sum of a fourth number which is a minimum number of weights having the selected form of weight required for expressing each bit group therewith, and a fifth number used for correcting errors between weight generators in the second number of weight generator groups. In this case, the fifth number may have a value specific to each weight generator group.

Also, in the present invention, the decoding means may include pattern generating means for generating a sixth plural number of different combination patterns of status signals representing the status of all weight generators included in the second number of weight generator groups, for use in an analog expression for each of values represented by the digital signal input, wherein the status signal has a first state for causing an associated weight generator to generate a weighted analog output having a weight of the weight generator, and a second state for causing the associated weight generator to generate a weighted analog output without the weight; and status signal selecting means for selecting status signals from the sixth number of different status signal combination patterns within a first period in which a given digital signal input is converted to an analog signal output, wherein the status signal selecting means uses the selected status signals to control the all weight generators to generate the weighted analog outputs from the all weight generators.

Further, in the present invention, the status signal selecting means may select and use the status signals of all of the sixth number of different combination patterns at least once within the first period. Alternatively, the status signal selecting means may select and use the status signals of all of the sixth number of different combination patterns of status signals at least once within a sequence of a plurality of the first periods, and select and use a portion of the sixth number of different combination patterns of status signals within each first period of the sequence of the plurality of the first periods.

Further, in the present invention, the digital-to-analog converter may include canceling means for canceling a constant offset in the magnitude of the analog signal output. The constant offset may be only a constant difference from an analog value represented by the digital signal input in the value of the analog signal output. Also, the plurality of different weight generators may comprise voltage or current sources each having a weight corresponding to the weight of each weight generator. The plurality of different weight generators may comprise voltage or current sources having a weight of a common magnitude, and weighting means for applying each source with a weight of each weight generator. The weighting means may comprise an R-2R ladder circuit.

Further, according to a third aspect, the present invention provides a sign-magnitude type digital-to-analog converter for converting a digital signal input from a digital form to an analog form, where the digital signal input is comprised of a sign bit representative of a sign, and a first plural number of bits each representative of a magnitude and having a different weight from each other. The digital-to-analog converter comprises decoding means connected to receive a digital signal input for dividing the first number of bits into a second plural number of bit groups; a second plural number of positive bit group converting means provided for the second number of bit groups for use when the sign bit indicates positive, wherein each positive bit group converting means selects and uses a form of weight for each bit group associated therewith, thereby converting the second number of bit groups to the analog form in response to the second number of bit groups to generate the second number of positive bit group analog outputs; a second number of negative bit group converting means provided for the second number of bit groups for use when the sign bit does not indicate positive, wherein each negative bit group converting means selects and uses a form of weight for each bit group associated therewith, thereby converting the second number of bit groups to the analog form in response to the second number of bit groups to generate the second number of negative bit group analog outputs; and adding means for adding the second number of positive bit group analog outputs and the second number of negative bit group analog outputs to form an analog signal output representative of the digital signal input.

Also, in the present invention, the digital-to-analog converter may further include sign bit converting means provided for the sign bit for selecting and using a weight for the sign bit to convert the sign bit to the analog form in response to the sign bit, thereby generating a sign bit analog output, wherein the adding means adds the sign bit analog output to the second number of positive bit group analog outputs and the second number of negative bit group analog outputs to form the analog signal output.

In the present invention, each of the bit group converting means may include a weight generator group having a third number of weight generators having a weight corresponding to the selected form of weight for each bit group, wherein the third number is a maximum number of weights having the selected form of weight required to express each bit group with said selected form of weight.

Also, in the present invention, as the selected form of weight for use in expressing each bit group in the plurality of bit groups, a weight associated with the least significant bit of each bit group corresponding thereto, or a weight associated with a bit in the first number of bits located at a bit position lower than the least significant bit is selected.

Particularly, in the present invention, the second number may be equal to or more than two and smaller than the first number. The third number in turn may be equal to a fourth number which is a minimum number of weights having the selected form of weight required for expressing each bit group therewith. Alternatively, the third number may be the sum of a fourth number which is a minimum number of weights having the selected form of weight required for expressing each bit group therewith, and a fifth number used for correcting errors between weight generators in the second number of weight generator groups. In this case, the fifth number may have a value specific to each weight generator group.

In the present invention, the second number may have the same value for the positive bit group converting means and the negative bit group converting means, or have a different value in between the second number for the positive bit group converting means and the negative bit group converting means.

In the present invention, the decoding means may include pattern generating means for generating a sixth plural number of different combination patterns of status signals representing the status of all of the weight generators, for use in an analog expression for each of values represented by the digital signal input, wherein the status signal has a first state for causing an associated weight generator to generate a weighted analog output having a weight of the weight generator, and a second state for causing the associated weight generator to generate a weighted analog output without the weight; and status signal selecting means for selecting status signals from the sixth number of different status signal combination patterns within a first period in which a given digital signal input is converted to an analog signal output, wherein the status signal selecting means uses the selected status signals to control the all weight generators to generate the weighted analog outputs from the all weight generators.

Also, the decoding means may include, for each of the second number of positive weight generator groups and the second number of negative weight generator groups, pattern generating means for generating a sixth plural number of different combination patterns of status signals representing the status of the second number of weight generators, for use in an analog expression for each of values represented by the digital signal input, wherein the status signal has a first state for causing an associated weight generator to generate a weighted analog output having a weight of the weight generator, and a second state for causing the associated weight generator to generate a weighted analog output without the weight; and status signal selecting means for selecting status signals from the sixth number of different status signal combination patterns within a first period in which a given digital signal input is converted to an analog signal output, wherein the status signal selecting means uses the selected status signals to control the all weight generators to generate the weighted analog outputs from the all weight generators.

Also, in the present invention, the status signal selecting means may select and use the status signals of all of the six number of different combination patterns at least once within the first period. Alternatively, the status signal selecting means may select and use the status signals of all of the six number of different combination patterns at least once within a sequence of a plurality of the first periods, and select and use a portion of the six number of different combination patterns within each first period of the sequence of a plurality of the first periods.

In the present invention, the digital-to-analog converter may further include canceling means for canceling a constant offset in the magnitude of the analog signal output. The constant offset may include only a constant difference from an analog value represented by the digital signal input in the value of the analog signal output. The plurality of different weight generators may comprise voltage or current sources each having a weight corresponding to the weight of each weight generator. The plurality of different weight generators may comprise voltage or current sources having a weight of a common magnitude, and weighting means for applying each source with a weight of each weight generator.

The above and other objects, features and advantages of the present invention will become apparent from the following detailed description of the preferred embodiments when read in conjunction with the accompanying drawings.

BRIEF DESCRIPTION OF THE DRAWINGS

FIG. 2 is a table showing the relationship between analog expressed levels and weight generators when 16 analog expressed levels are expressed by two forms of weight (x4, x1) in the D/A converter A illustrated in FIG. 1;

FIG. 3 is a table showing the relationship among the number of expressed bits, the number of bits in each of upper and lower bit groups, when the number of expressed bits is divided into two, and the number of required weight generating elements for each of the upper and lower bit groups in the D/A converter A illustrated in FIG. 1;

FIG. 4 is a table showing the relationship between the number of expressed bits and the total number of weight generators in the second prior art conversion scheme shown in FIG. 24 for purposes of comparison with the present invention in FIG. 3;

FIG. 6 is a table showing weight generator control patterns for the D/A converter B illustrated in FIG. 5, when 16 analog expressed levels (=4 bits) are expressed by two forms of weight (x4 and x1);

FIGS. 8(a)–8(d) show different pattern selection methods for use with a pattern selector 220B in a decoder 2B of the D/A converter B illustrated in FIG. 5;

FIG. 9 is a table showing the relationship among the number of expressed bits, the number of bits in each of divided bit groups, and the number of required weight generators in each of the bit groups, when the number of expressed bits is divided into two in the D/A converter B illustrated in FIG. 5;

FIG. 10 is a table showing the relationship among the number of expressed bits, the number of bits in each of divided bit groups, and the number of required weight generators in each of the bit groups, when the number of expressed bits is divided into three in the D/A converter B illustrated in FIG. 5;

FIG. 13 is a table showing patterns generated by a decoder 2C in the D/A converter C illustrated in FIG. 12, when ±16 levels (=5 bits) are expressed by two forms of weight (x4, x1) in the sign-magnitude format;

FIG. 14 is a block diagram illustrating a D/A converter D according to a fourth embodiment of the present invention;

FIG. 16 is a table, similar to FIG. 13, showing averaging patterns when ±16 levels (=5 bits) are expressed using two forms of weight (x4, x1) in the sign-magnitude format;

FIGS. 17(a) and 17(b) are tables showing averaging patterns for detailing the averaging between the positive and negative sides in the averaging patterns in FIG. 16, where FIG. 17(a) shows how respective weights are selected when the level is at "5," by way of example, and FIG. 17(b) shows how respective weights are selected when the level varies;

FIG. 18 is a table showing the relationship among the number of expressed bits, the number of bits in each of divided bit groups, and the number of weight generating elements required for each of the bit groups when the number of expressed bits is divided into two in accordance with the bit division method shown in FIG. 13 for the D/A converter C illustrated in FIG. 12;

FIG. 19 is a table showing the relationship between the number of expressed bits and the total number of weight generators according to the first prior art converting method shown in FIG. 24;

FIG. 20 is a table showing the relationship between the number of expressed bits and the total number of weight generators according to the second prior art converting method shown in FIG. 25;

FIG. 21 is a table showing the relationship among the number of expressed bits, the number of bits in each of divided bit groups, and the number of weight generating elements required for each of the bit groups when the number of expressed bits is divided into two in accordance with the bit division method shown in FIG. 16 for the D/A converter D illustrated in FIG. 14;

FIG. 22 is a table showing respective analog expressed levels and ON/OFF states of respective weight generating elements for expressing these levels when using a multibit scheme, one of the prior art D/A conversion schemes, for a binary digital signal to be D/A converted, wherein binary four bits (=16 levels) are expressed by four different forms of weight, i.e., x1, x2, x4, x8 weights;

FIG. 23 is a table showing respective analog expressed levels and ON/OFF states of respective weight generating elements for expressing these levels when using another prior art D/A conversion scheme, for a binary digital signal to be D/A converted, wherein binary four bits (=16 levels) are expressed by 16 weights having a single form of weight, i.e., 16 x1 weights;

FIG. 24 is a table showing the relationship between respective analog expressed levels and ON/OFF states of weight generating elements for expressing the same when the prior art conversion method shown in FIG. 22 is used in a sign-magnitude format, wherein binary five bits (=±16 levels) are expressed by four different forms of weight, i.e., x1, x2, x4, x8 weights; and FIG. 25 is a table showing the relationship between respective analog expressed levels and ON/OFF states of weight generating elements for expressing the same when the prior art conversion method shown in FIG. 23 is used in the sign-magnitude format, wherein binary five bits (=16 levels) are expressed by a single form of weight, i.e., x1 weight.

DETAILED DESCRIPTION OF THE INVENTION

The present invention will hereinafter be described in detail with reference to the accompanying drawings.

Figure 1:
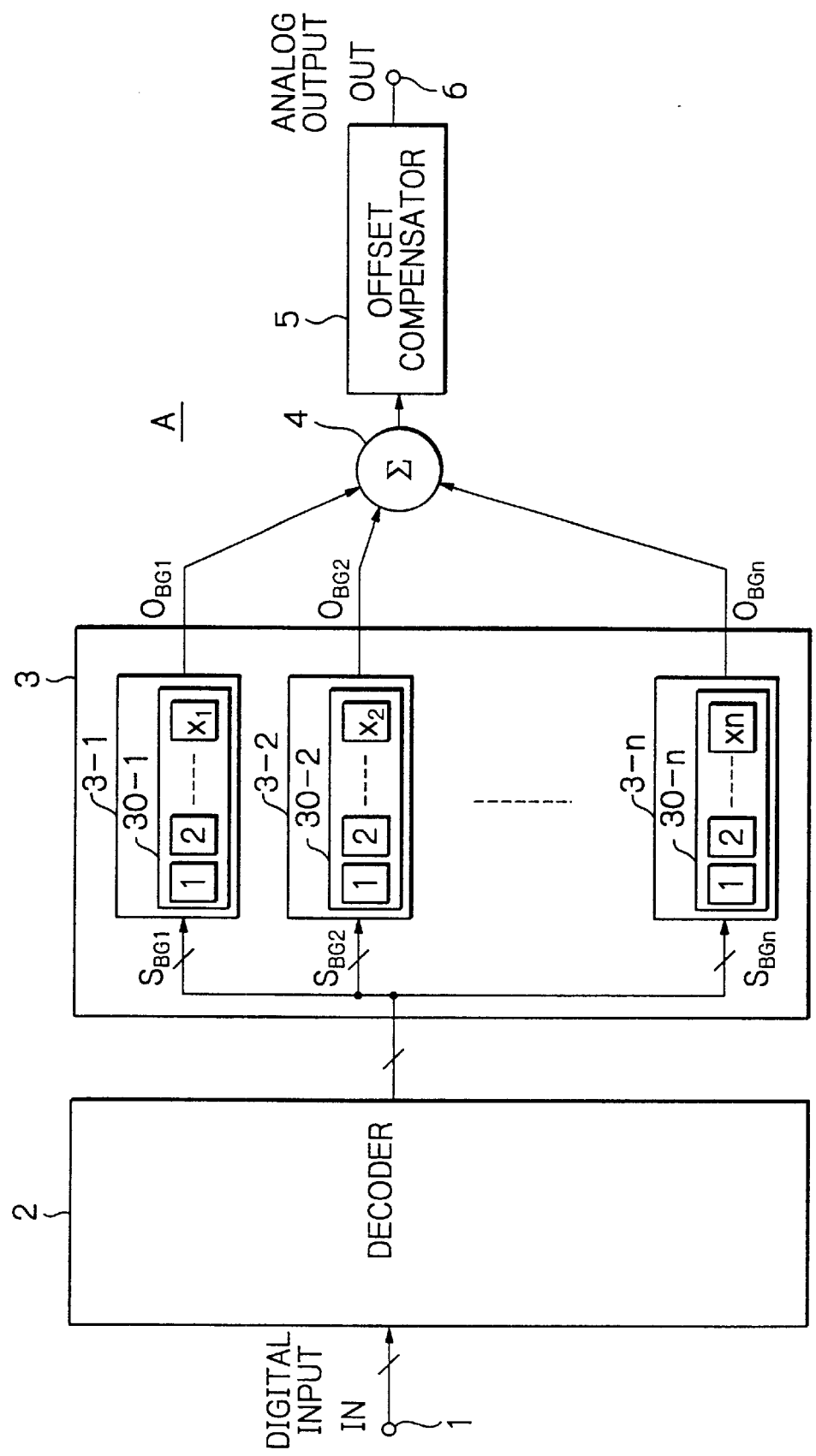
FIG. 1 is a block diagram illustrating a D/A converter A according to a first embodiment of the present invention.

FIG. 1 is a block diagram illustrating a first embodiment of a D/A converter A according to the present invention. As illustrated, the D/A converter A comprises an input terminal 1 for receiving a binary digital input signal IN comprised of multiple bits; a decoder 2 connected to the input terminal 1; a bit group conversion unit 3 including bit group converters 3-1, 3-2, . . . , 3-n, each of which is connected to each of a plurality of bit group outputs of the decoder 2; an adder 4 for receiving respective outputs of the bit group converters to add them up; an offset compensator 5 connected to the output of the adder 4; and an output terminal 6 connected to the output of the offset compensator 5.

Describing in greater detail, the input terminal 1 receives a binary digital word comprised of m bits. The digital word may include a sign bit. The decoder 2, which receives the digital word, divides the m bits composing the input digital word, into n bit groups BG1, BG2, . . . , BGn. The m-bit digital word is divided into two or more bit groups, where the division number n should be smaller than the number of bits before the division, i.e., m (n<m). The number of bits p1, p2, . . . , pn, composing each bit group, is at least one (P=1). Also, the m bits of the input digital word may be divided such that each bit group only includes adjacent bits. For example, as shown in FIG. 2, later described, one group is comprised of the first bit (x8), which is the most significant bit (MSB), and the second bit (x4) which is one bit lower than the MSB. Then, another group is comprised of the third bit (x2), which is further one bit lower, and the fourth bit (x1) or the least significant bit (LSB). Alternatively, the m bits of the digital word may be divided such that each bit group includes bits which are not adjacent to each other. For example, one group may be comprised of the first bit and the third bit, and another group may be comprised of the second bit and the fourth bit. Based on the bit groups thus formed by dividing the input digital word, bit group status signals SBG1, SBG2, . . . , SBGn are generated for controlling weight generators (shown in FIG. 1) in the respective bit group converters 3-1, 3-2, . . . , 3-n.

FIG. 1 also illustrates in detail the bit group converters 3-1, 3-2, . . . , 3-n. All of these bit group converters may be implemented by using the same type of D/A converting scheme. Appropriate types of D/A converting schemes for use with the bit group converters include, for example, a binary resistor type; a R-2R ladder type; a binary weighted current source type; a capacitor array type; and so on. Each of the bit group converters includes a weight generator unit 30-1, 30-2, . . . , or 30-n, as illustrated, for D/A converting the bit group BG1, BG2, . . . , BGn associated with the converter. Each weight generator unit includes a number of weight generators required to D/A convert the associated bit group. In this event, selected as a weight generated by a weight generator in each weight generator unit may be a weight for the least significant bit in an associated bit group, or even a weight for a bit lower than the least significant bit. In an example shown in FIG. 2, later described, a weight for the second bit (x4) is used for the upper bit group, and a weight for the fourth bit (x1) is used for the lower bit group. Also, the number of weight generators included in each weight generator unit should be a minimum number x required for D/A converting an associated bit group. The numbers x for the respective weight generator units are x1, x2, . . . , xn which are specific to the respective bit groups 3-1, 3-2, . . . , 3-n associated therewith. In the example of FIG. 2, the upper and lower bit groups both have three weight generators. These weight generators may be either a current source type or a voltage source type. Also, each weight generator may be implemented by using sources, each of which is assigned a particular weight, or by combining a common source with a weighting means such as an R-2R ladder circuit.

Bit group analog outputs OBG1, OBG2, . . . , OBGn resulting from D/A conversions of the respective bit groups, generated by the associated bit group converters 3-1, 3-2, ..., 3-n, are added by the adder 4 at the next stage. Then, the output of the adder 4 is compensated for offset as required, and a final analog output signal OUT is generated. The offset compensation, which cancels a fixed offset in the analog output after the addition, can be performed as required. While FIG. 1 illustrates that the offset compensation is performed after the addition in the adder 4, the offset compensation may be performed at another point within the D/A converter, or at an appropriate point external to the D/A converter, as will be apparent to those skilled in the art.

Next, the generation of the bit group status signals in the decoder 2 will be described with reference to FIG. 2. As previously mentioned, in FIG. 2, m is equal to four (m=4), n is equal to two (n=2), p1 and p2 are equal to two (p1=2, p2=2) for the upper and lower bit groups (denoted BG1 and BG2, respectively, for convenience of explanation), selected forms of weight are x4 for the upper group BG1 and x1 for the lower group BG2, and the numbers of weight generators are x1=3 and x2=3 for BG1 and BG2, respectively. Also, with the parameters selected as above, the table shows the relationship between analog output levels and ON/OFF control of associated weight generators when 16 analog output levels are expressed by two forms of weight (x4, x1). In the table, a black circle indicates ON, and a white circle indicates OFF. This notation also applies to all such tables which may appear later in this specification. For example, at an analog output level "10," two x4 weight generators turn ON, and two x1 weight generators turn ON. The table may be implemented as a lookup table which may be stored in a memory provided, for example, in the decoder 2. In an alternative, the table may be implemented by a logic circuit.

Next, the operation of the D/A converter A according to the first embodiment will be described with reference to the example of FIG. 2. First, as the D/A converter A receives, for example, a 4-bit digital word IN, the decoder 2 decodes the digital word, accesses the lookup table of FIG. 2 at an address corresponding to a decimal value represented by the word, and generates, as a result, a 6-bit status signal corresponding to black circles and white circles in the decimal value. For example, the decoder 3 generates "011011" for a level "10" in decimal. The upper three bits of the six bits is used as a bit group status signal SBG1; and the lower three bits as a bit group status signal SBG2. Next, the bit group converters 3-1, 3-2, which receive the bit group status signals SGB1, SBG2, respectively, only turn ON a number of weight generators equal to the number of "1"s in the respective status signals (in the described example, two weight generators in both the two bit groups), and output bit group analog outputs OBG1 (which represents "8" (=2×4) in decimal) and OBG2 (which represents "2" (=2×1) in decimal). The bit group analog outputs are added in the adder 4 to output a final analog output OUT which is the result of the D/A conversion performed by the D/A converter A of the first embodiment. An offset caused by the circuit configuration, if any, is canceled by the offset compensator 5. In this way, the D/A converter A of the present invention can convert a digital signal to an analog signal represented thereby.

Advantageously, the D/A converter of the present invention can reduce the trimming among different forms of weight, as compared with the aforementioned first conversion scheme of the prior art. As is apparent from a comparison of FIG. 2 with FIG. 22, in the example shown in FIG. 2, the number of trimmings is reduced from three to one. This reduction in the amount of expensive trimming is effective in a reduction of the cost. Also advantageously, the number of required weight generators can be reduced as compared with the aforementioned second conversion scheme of the prior art. As is apparent from a comparison of FIG. 2 with FIG. 23, the number of weight generators is reduced from 15 to six, i.e., approximately by a factor of three. Thus, in the D/A converter of the present invention, an area required for the weight generators on a semiconductor chip is reduced accordingly by the same factor. A further reduction in the cost is achieved also in this aspect.

FIG. 3 shows the relationship among the number of expressed bits; the numbers of bits in the upper and lower bit groups, when the number of expressed bits is divided into two; and the numbers of weight generating elements required for the upper and lower bit groups, for the case where the bits of a digital input signal is divided into two bit groups in the D/A converter A of the first embodiment. The total number of weight generators (Total A) is expressed by the following equation (1). For purposes of comparison, FIG. 4 shows the relationship between the number of expressed bits and the total number of weight generators (Total PA2) in the second conversion scheme (FIG. 23) of the prior art. The total number of weight generators in the comparison example is expressed by the following equation (2).

$$\text{Total } A = (2^{p1}-1) + (2^{p2}-1) \qquad (1)$$

$$\text{Total } PA2 = 2^{m}-1 \qquad (2)$$

where m is the number of expressed bits, p1 is the number of bits in the upper bit groups, and p2 is the number of bits in the lower bit group (m=p1+p2).

As will be understood from a comparison between the tables of FIGS. 3 and 4, for the number of expressed bits m equal to eight (m=8), the conventional scheme requires the total number of weight generators equal to 255, whereas the present invention requires 128 even at maximum, which is approximately one half, and 30 at minimum, which is approximately one eighth. Thus, a significant reduction in the number of weight generators can be accomplished.

Figure 5:
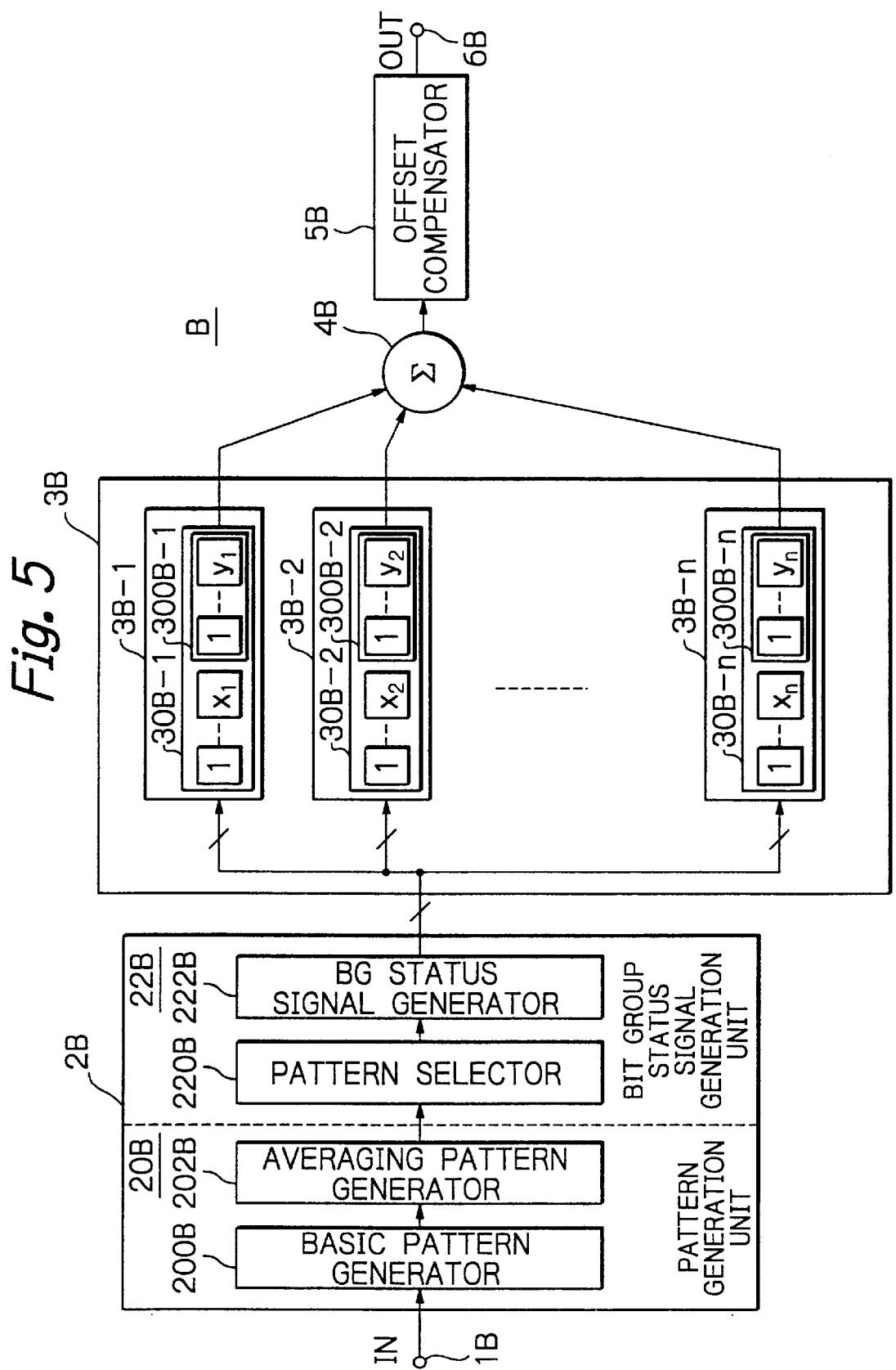
FIG. 5 is a block diagram illustrating a D/A converter B according to a second embodiment of the present invention.

Next, a D/A converter B according to a second embodiment of the present invention will be described with reference to FIG. 5. The illustrated D/A converter B is substantially the same as the converter A illustrated in FIG. 1. In FIG. 5, corresponding elements are designated the same reference numerals followed by a letter "B." The D/A converter B in FIG. 5 differs from the D/A converter A in that in the former, a decoder 2B comprises a pattern generation unit 20B and a bit group status signal generation unit 22B, and that each of a multiplicity of bit group converters 3B-1, 3B-2, ..., 3B-n within the bit group conversion unit 3B comprises an additional weight generator unit 300B-1, 300B-2, ..., or 300B-n. The remaining adder 4B and offset compensators 5B are similar to their counterparts in FIG. 1.

Describing in greater detail, the D/A converter B is configured to eliminate the trimming which is required in the D/A converter A of FIG. 1. Specifically, in the D/A converter B, averaging between different forms of weight is performed, instead of the trimming among different forms of weight, to reduce the influence by errors among different forms of weight. For this purpose, each of the bit group converter units 3B-1, 3B-2, ..., 3B-n is provided with the additional weight generator unit 300B-1, 300B-2, ..., 300B-n in addition to a weight generator unit 30B-1, 30B-2, ..., 30B-n, similar to the weight generator 30-1, 30-2, ..., 30-n in FIG. 1, as mentioned above. Each additional weight generator unit comprises a number of additional weight generators 1 ... y1, 1 ... y2, ..., or 1 ...

yn, required to provide averaging between weights having different forms of weight. Weights generated by the additional weight generators are the same as those generated by their associated weight generators. The numbers y1, y2, ..., yn of the additional weight generators are specific to the respective bit group converters, and are not necessarily the same. Corresponding to the change in configuration of the weight generator unit, the pattern generation unit 20B of the decoder 2B receives an input digital word IN, and generates a plurality of averaging patterns, for example, as shown in FIG. 6 (patterns (1)–(4) in FIG. 6). Then, the bit group status signal generation unit 22B selects one from the plurality of averaging patterns to generate bit group status signals for a plurality of bit group converters. In response to the bit group status signals, the weight generators and the additional weight generators in each bit group are controlled to turn ON/OFF to convert an associated bit group into an analog output. Then, the analog outputs from the respective bit groups are added in the adder 4B, and passed through the offset compensator 5B, and a final analog output signal OUT is generated at an output terminal 6B.

Next, the pattern generation unit 20B will be described below in detail. In an embodiment of the present invention, the pattern generation unit 20B comprises a basic pattern generator 200B and an averaging pattern generator 202B, as illustrated in FIG. 5. The basic pattern generator 200B generates a basic pattern for controlling the weight generator unit 30B in each bit group converter, similarly to the decoder 2 in FIG. 1. The basic pattern generated by the generator 200B is such one as previously shown in FIG. 2. The averaging pattern generator 202B, which is especially provided in the D/A converter B, generates an averaging pattern, generated by applying averaging to basic patterns, for controlling the weight generator unit 30B which has the additional weight generator unit 300B in each bit group converter. In an alternative, the basic pattern generator 200B may be omitted such that the averaging pattern generator 202B forms therein an averaging pattern directly from inputs.

Next, exemplary patterns shown in FIG. 6 will be described. Like FIG. 2, FIG. 6 shows a table of weight generator control patterns when 16 analog output levels (=4 bits) are expressed by two forms of weight (x4 and x1). In the table of FIG. 6, the three right-hand columns of x4 and the three left-hand columns of x1 in pattern (1) are identical to the patterns in FIG. 2. Moreover, FIG. 6 includes additional one weight generator for x4 and three weight generator for x1 for averaging. The averaging pattern controls the weight generator unit 30B including these additional weight generators by averaging all the weight generators. In the examples of FIG. 6, there are four averaging patterns (1)–(4). As can be seen in the table, at levels 0, 4, 8, 12, no changes are found among the patterns (1)–(4). The averaging pattern changes from pattern (3) to pattern (4) at levels 1, 5, 9, 13; from pattern (2) to pattern (3) at levels 2, 6, 10, 14; and from pattern (1) to pattern (2) at levels 3, 7, 11, 15. The changes are caused by changes in four x1 weights and one x4 weight. In this way, the averaging can be performed over the weight having different forms of weight.

The bit group status signal generation unit 22B, which receives a plurality of averaging patterns as mentioned, comprises a pattern selector 220B and a bit group status signal generator 222B. Specifically, the pattern selector 220B selects one by one the plurality of averaging patterns in the order of the numbers given thereto (described later with reference to FIG. 8). The bit group status signal generator 222B, which receives the selected averaging pattern, generates a bit group status signal for each bit group converter from the received averaging pattern to cause each bit group generator to generate a bit group analog signal. In this embodiment, as can be seen from the table of FIG. 6, the adder 4B (FIG. 5) adds bit group analog signals from the respective bit group converter units 3B-1, 3B-2, ..., 3B-n to deliver an analog output which has an offset for three x1 weights. This offset, however, is canceled by the offset compensator 5B.

Figure 7:
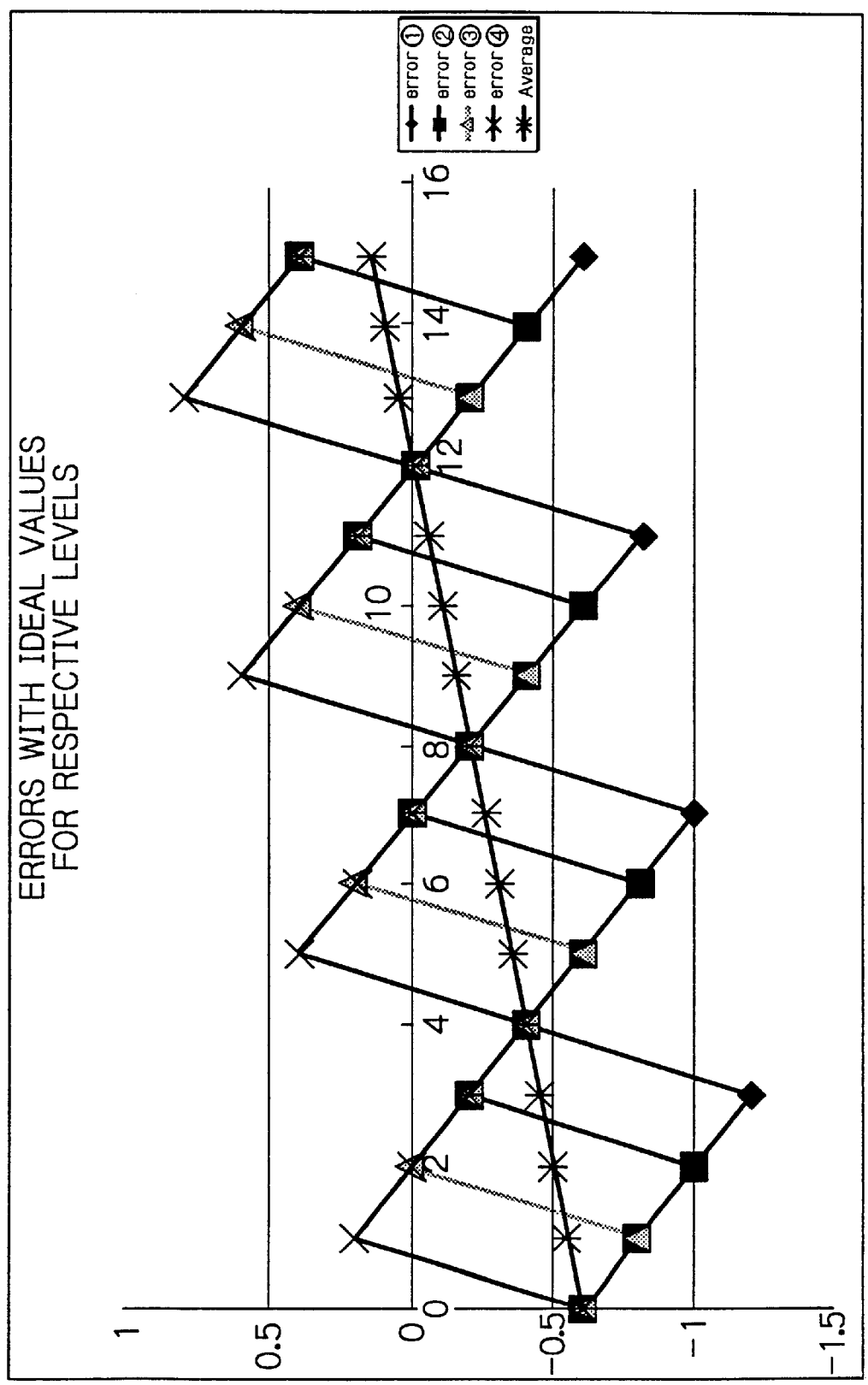
FIG. 7 is a graph for explaining the characteristics of the D/A converter B in FIG. 5, showing analog output errors (along the vertical axis) with respect to respective levels 0–15 (along the horizontal axis) of the D/A converter B when a −5% error is given to x4 weights, and a +20% error is given to x1 weights in the exemplary patterns shown in FIG. 6.

Next, the characteristics of the D/A converter B will be described with reference to FIG. 7. FIG. 7 illustrates analog outputs with respect to the respective levels 0–15 of the D/A converter B when the x4 weight is given −5% error, and the x1 weight is given +20% error in the example of FIG. 6. In FIG. 7, the vertical axis indicates the magnitude of error, and the horizontal axis indicates the expressed analog level. A plot for error (1) indicates an error caused only by the averaging pattern (1). Similarly, plots for errors (2), (3), (4) indicate errors caused by the averaging patterns (2), (3), (4), respectively. An average plot indicates an error resulting from averaging of the averaging patterns (1)–(4). As illustrated, while each of the individual averaging patterns suffers a distortion since the error is not linear, the averaged error results in a straight line. Thus, while complete elimination is not expected, the error is linear to the input level, so that no distortion will occur although a gain error results.

Next, how the pattern selector 220B in the decoder 2B selects a pattern will be described with reference to FIGS. 8(a)–8(d). In FIGS. 8(a)–8(d), symbols (1), (2), (3), (4) indicate the averaging patterns (1), (2), (3), (4) in FIG. 6, respectively. References a1, a2, a3, a4 and so on each indicate a main period for converting a given digital signal to an analog signal. Referring first to FIG. 8(a), a shown repetition pattern uses all of the four patterns in one main period, which are selected once in the order of the pattern number. In this way, errors between the weights having different forms of weight can be suppressed, as shown in FIG. 7. Next, a repetition pattern shown in FIG. 8(b) subdivides one main period into sub-periods in each of which each of the averaging patterns (1), (2), (3), (4) is selected once in the order of the pattern number. As a result, within one main period, a sequence of the averaging patterns (1), (2), (3), (4) is repeated twice or more (in FIG. 8(b), twice). In this repetition pattern, the error is distributed in a wider band, thus resulting in a reduction in energy of the error in a predetermined band. A pattern shown in FIG. 8(c) only uses a single averaging pattern in one main period so that the four averaging patterns are used one by one in order over four main periods. This repetition pattern may be used when a given one D/A conversion main period for a digital word cannot be subdivided, and even in such a case, a certain degree of error distribution can be achieved. In a repetition pattern shown in FIG. 8(d), though similar to that of FIG. 8(c), one averaging pattern is repeated over two or more main periods. This pattern also provides a certain degree of error distribution. It should be noted that the length of the main period is identical in FIGS. 8(a)–8(d), and the respective main periods in different figures are shown in different lengths only for convenience of illustration.

Next, the advantage of the bit division in the D/A converter B of the second embodiment will be described with reference to FIGS. 9 and 10. The shown tables are similar to that of the aforementioned FIG. 3, and each show the relationship among the number of expressed bits, the number of bits in each of the divided bit groups, and the number of required weight generating elements for each group for the case where the bits representing a digital input signal are divided into a plurality of bit groups. FIG. 9 shows such relationship when the bits are divided into two, in which case, the total number of required weight generators (Total B2) can be expressed by the following equation (3). FIG. 10 shows such relationship when the bits are divided into three, in which case the total number of required weight generators (Total B3) can be expressed by the following equation (4).

$$\text{Total } B2 = 2^{p1} + 2*(2^{p2} - 1) \tag{3}$$

$$\text{Total } B3 = 2^{p1} + (2^{p1} - 1) + 2*(2^{p3} - 1) \tag{4}$$

where m is the number of expressed bits, p1 is the number of bits in the upper bit group, p2 is the number of bits in the lower bit group (in the middle bit group when divided into three), and p3 is the number of bits in the lower bit group. In comparison with the prior art when the number of expressed bits is eight, the number of required weight generators, when at minimum, is 46 for the two division configuration (approximately one fifth as compared with the prior art shown in FIG. 4), and 20 for the three division configuration (approximately one thirteenth as compared with the prior art shown in FIG. 4). It should be noted that in the case of the three division configuration, the number of required weight generators can be reduced ten more from 30 in the case of FIG. 3, although the averaging is added.

Figure 11:
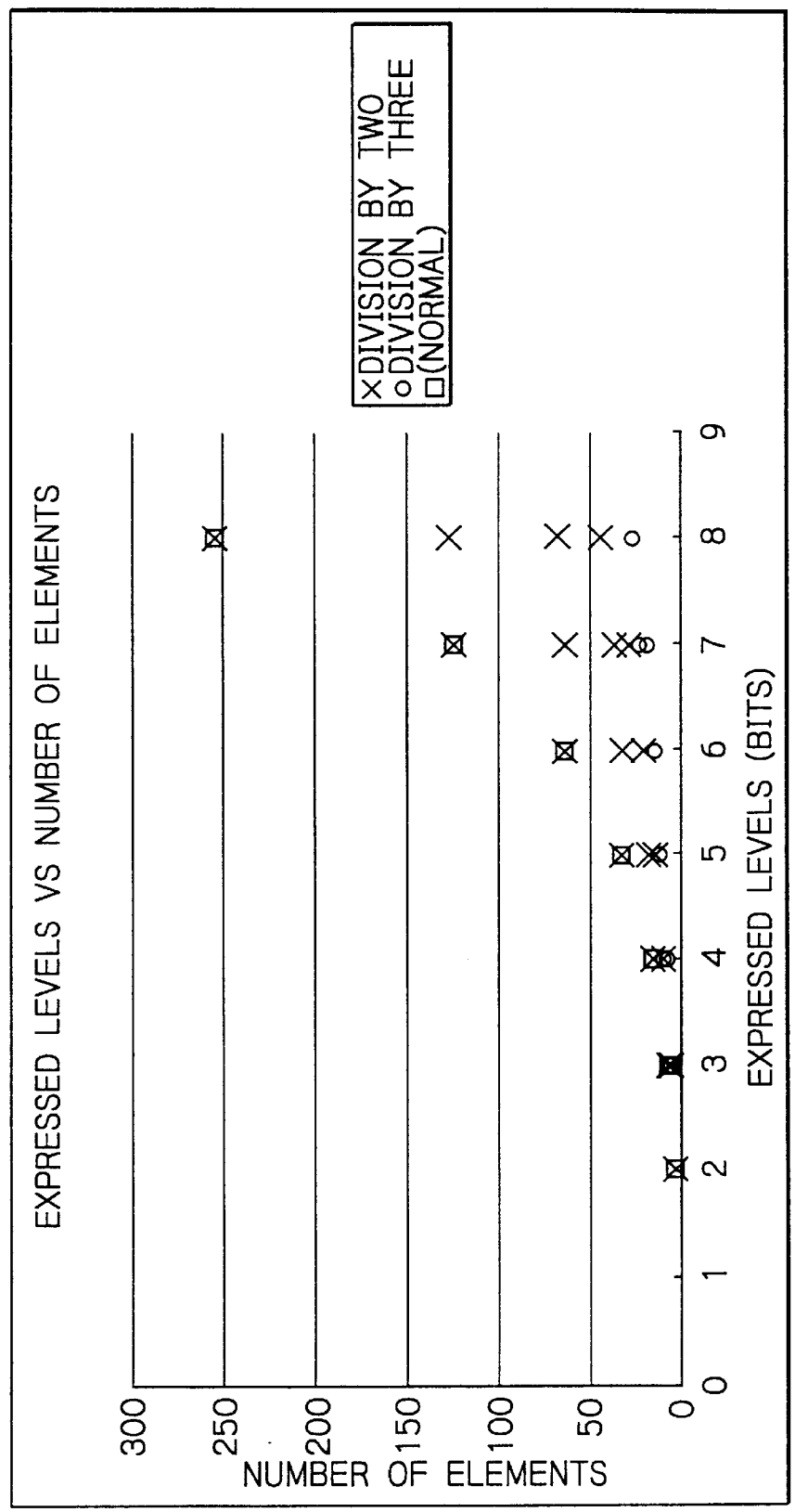
FIG. 11 is a graph for summarizing the table associated with the prior art in FIG. 4 and the tables associated with the present invention in FIG. 9 (division by two) and FIG. 10 (division by three), where the horizontal axis indicates a expressed level, and the vertical axis indicates the number of required weight generators.

FIG. 11 illustrates a graph which summarizes the relationships represented in FIGS. 4 and 9 (for the two division configuration) and FIG. 10 (for the three division configuration), where the horizontal axis indicates a expressed level, and the vertical axis indicates the number of required weight generators. As can be seen also from FIG. 11, a significant reduction in the number of required weight generators can be made as compared with the second prior art conversion scheme. "Normal" in the graph indicates the case of the prior art scheme shown in FIG. 4.

Figure 12:
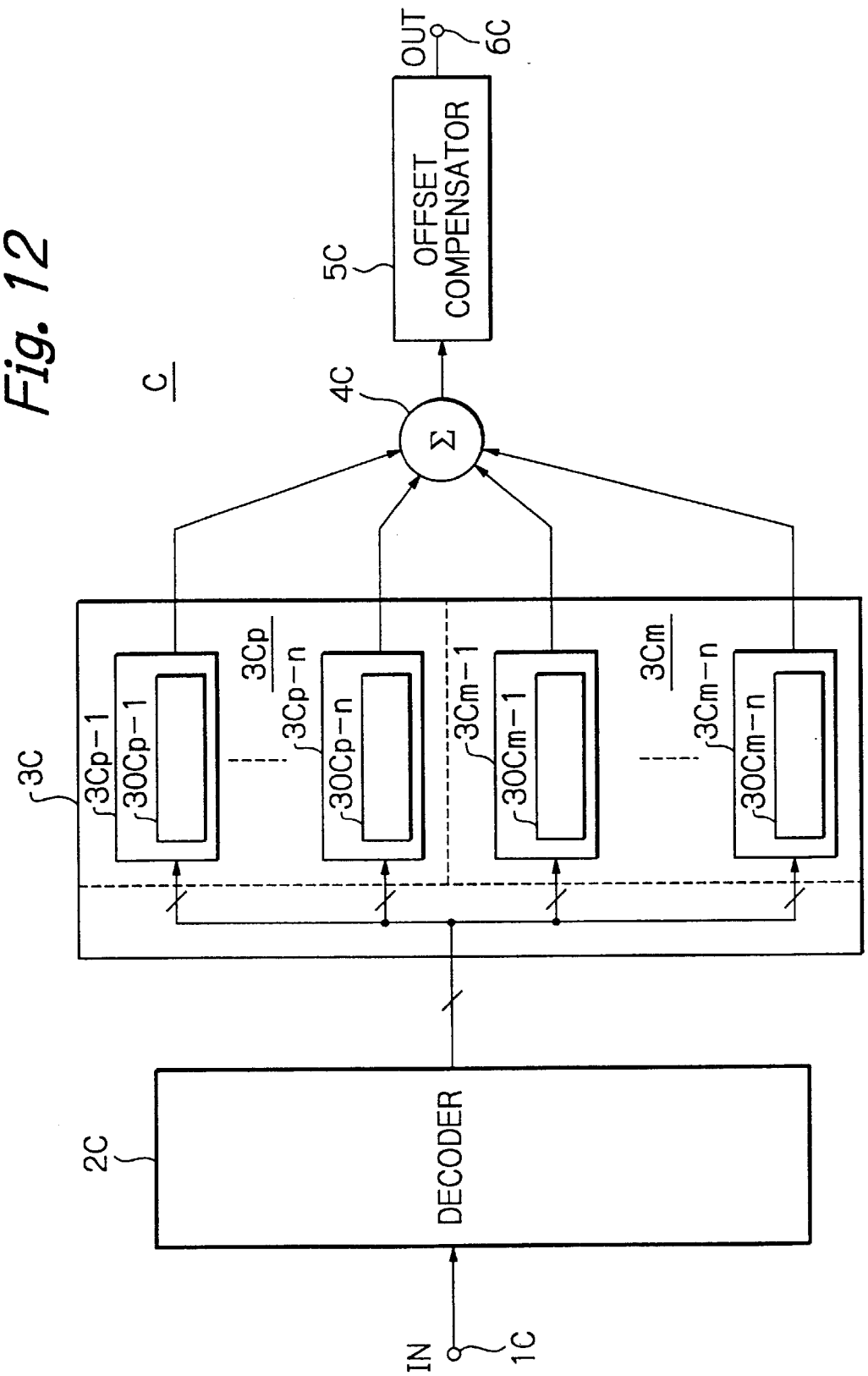
FIG. 12 is a block diagram illustrating a D/A converter C according to a third embodiment of the present invention.

Next, a D/A converter C according to a third embodiment of the present invention will be described with reference to FIG. 12. In the third embodiment, the present invention is applied to a sign-magnitude type D/A converter. Therefore, the D/A converter C is basically similar to the D/A converter A illustrated in FIG. 1 and the D/A converter B illustrated in FIG. 5, and comprises a decoder 2C, an adder 4C, and an offset compensator 5C. The third embodiment differs largely from the first and second embodiments in that a bit group conversion unit 3C is composed of two bit group converter units 3Cp, 3Cm for positive and negative sides, respectively. Thus, the converter unit 3Cp includes a plurality of bit group converters 3Cp-1, . . . , 3Cp-n, while the converter unit 3Cm includes a plurality of bit group converters 3Cm-1, . . . , 3Cm-n. Each of the converters in these converter units may be configured similarly to either of the plurality of bit group converters 3-1, . . . , 3-n (FIG. 1) or 3B-1, . . . , 3B-n (FIG. 5).

When the D/A converter C is the type which does not involve the averaging, as is the case of the D/A converter A of FIG. 1 (requiring the trimming), the decoder 2C generates patterns, for example, as shown in FIG. 13. FIG. 13 shows the configuration for expressing ±16 levels (=5 bits) with two forms of weight (x4, x1) in the sign-magnitude format. In the illustrated example, the positive converter unit 3Cp comprises a total of seven weight generators, and receives a pattern consisting of three left-hand x4 columns, three left-hand x1 columns, and one right-hand x1 column (corresponding to a sign bit). The negative converter unit 3Cm comprises a total of six weight generators which receive a pattern consisting of the remaining columns. As can be seen from FIG. 13, only one x1 weight generator is added to twice the number of weight generators in FIG. 2, as compared with FIG. 2. Also in this case, the trimming between the weights having different forms of weight is required only at one position on each of the positive side and the negative side. In this example, the same division method and the same division number are employed on both the positive and negative sides.

When the D/A converter C is the type which involves the averaging, as is the case of the D/A converter B in FIG. 5, the decoder 2C generates patterns as shown in FIG. 6 for each of the positive side and the negative side. Thus, the averaging operation is performed independently on the positive side and the negative side. In this way, the effect of the averaging can also be produced in the sign-magnitude format. Further, in this example, the same division method and the same division number are employed in both the positive and negative sides.

Next, a D/A converter D according to a fourth embodiment of the present invention will be described with reference to FIG. 14. The D/A converter D is intended to provide the averaging not only for each of the positive and negative sides but also in between the positive side and the negative side in the sign-magnitude format. For this reason, while the D/A converter D comprises a decoder 2D, an adder 4D and an offset compensator 5D similar to those of the D/A converter C illustrated in FIG. 12, a bit group conversion unit 3D largely differs from the counterpart in the D/A converter C. Specifically, the conversion unit 3D is not divided into a positive side and a negative side, as in FIG. 12, but comprises bit group converters 3D-1, 3D-2, . . . , 3D-n, similarly to FIG. 5, wherein each of the group converters includes both a positive weight generator 30Dp-1, . . . , 30Dpn and a negative weight generator 30Dm-1, . . . , 30Dm-n. A weight generator in the same converter has the same form of weight irrespective of the positive side or the negative side. In this embodiment, the positive and negative weight generators in each bit group converter are also used for generating the opposite-sign weight for the averaging between the positive side and the negative side.

As previously described, the bit group converters in FIGS. 1, 5, 12 and 14 perform a digital-to-analog conversion of the bit group status signals $S_{BG1,2\ldots n}$ to produce the bit group analog outputs $O_{BG1,2\ldots n}$. FIG. 14(a) illustrates digital-to-analog conversion circuitry with a differential configuration which can be included in the bit group converters 3D-1,2 . . . n referred to.

Figure 14A:
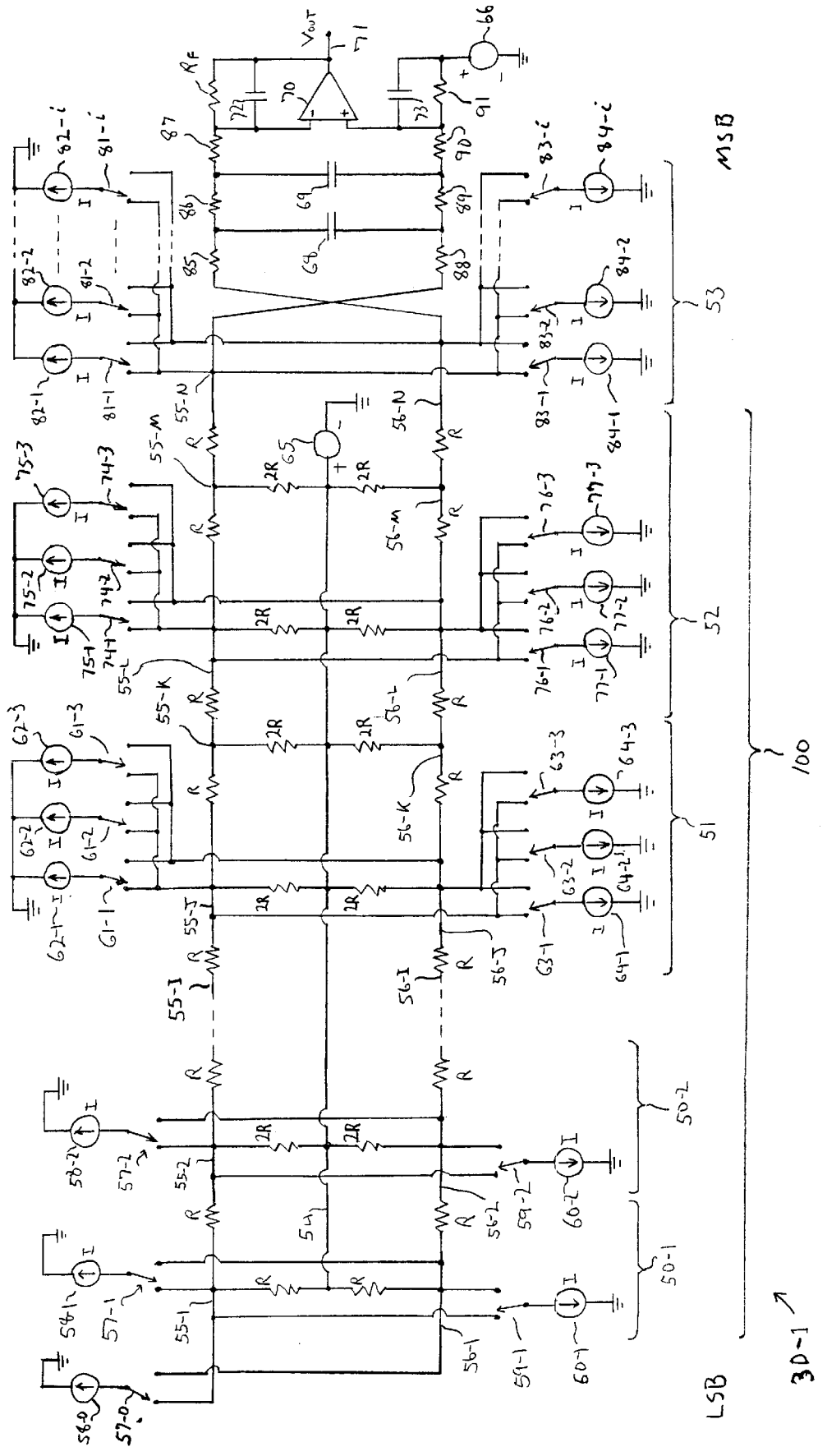
FIG. 14(a) is a detailed schematic diagram of one implementation of the D/A converter D of FIG. 14.

Referring to FIG. 14(a), one of the bit group converters, specifically bit group comparator 3D-1, includes a differential R-2R DAC ladder section 100 and a switched current source DAC section 53. R-2R DAC ladder section 100 includes N conventional R-2R sections connected as shown. For example, two resistors of resistance 2R are connected in series between conductors 55-2 and 56-2, 55-3 and 56-3, and so on. At the left end, two resistors of resistance R are connected between conductors 55-1 and 56-1. Conductor 55-1 is coupled by another resistor of resistance R to conductor 55-2, and similarly, conductor 56-1 is coupled by a resistor R to conductor 56-2. This pattern continues to the right in FIG. 14(a). At the right end portion of the R-2R DAC ladder section 100, a conductor 55-M is coupled by a resistor R to a conductor 55-N, and two resistors of resistance 2R are coupled between conductor 55-M and conductor 56-M. Similarly, conductor 56-M is coupled by a resistor R to conductor 56-N. The junctions between the two resistors 2R are coupled by conductor 54 to a voltage source 65 as shown.

Each of conductors 55-1,2 . . . I is coupled by a corresponding switch 57-1,2 . . . I to one terminal of a corresponding unit current source 58-1,2 . . . I, respectively. Similarly, each of conductors 56-1,2 . . . I is coupled by a corresponding switch 59-1,2 . . . I to one terminal of a corresponding unit current source 60-1,2 . . . I, respectively. At the left end, switch 57-0 and unit current source 58-0 are connected to conductor 55-1 and 56-1 as shown. The second terminal of each unit current source is connected to ground. Each unit current source supplies a constant current I. Each of switches 57-0,1,2 . . . I and 59-1,2 . . . I is a single pole, double throw switch having its single pole terminal coupled to one terminal of a corresponding unit current source. The left double throw terminals of switches 57-0,1,2 . . . I and 59-1,2 . . . I as shown in FIG. 14(*a*) are connected to conductors 55 -1,2 . . . I, respectively, and the right double throw terminals of of switches 57-1,2 . . . I and 59-1,2 . . . I are connected to conductors 56-1,2 . . . I, respectively.

Similarly, conductor 55-J is connected to the right double throw terminals of single pole, double throw switches 61-1,2,3 and to the left double throw terminals of single pole, double throw switches 63-1,2,3. Similarly, conductor 56-J is connected to the right double throw terminals of switches 61-1,2,3 and 63-1,2,3. The single throw terminals of switches 61-1,2,3 are connected to one terminal of unit current sources 62-1,2,3, respectively, and the single throw terminals of switches 63-1,2,3 are connected to one terminal of unit current sources 64-1,2,3, respectively. The second terminal of each of the foregoing unit current sources is connected to ground. Similarly, conductors 55-L and 56-L are connected to the double throw terminals of three upper single pole, double throw switches 74-1,2,3 and three lower single pole, double throw switches 76-1,2,3, respectively, the other terminals of which are connected to corresponding unit current sources 75-1,2,3 and 77-1,2,3 as shown.

Switched current source DAC section 53 includes i upper unit current sources 82-1,2 . . . i, each having one terminal connected to ground and another terminal connected to the single pole terminal of a corresponding single pole, double throw switch 81-1,2 . . . i, respectively. "i" may be equal to 16. Switched current source DAC section 53 also includes i unit current sources 84-1,2 . . . i each having one terminal connected to ground and another terminal connected to the single pole terminal of a corresponding single pole, double throw switch 83-1,2 . . . i, respectively. The left double throw poles of switches 81-1,2 . . . i and 84-1,2, . . . i are connected to conductor 55-N. The right double throw poles of switches 81-1,2 . . . i and 84-1,2, . . . i are connected to conductor 56-N. Conductor 55-N is coupled by sequentially connected resistors 88, 89, and 90 to the (+) input of a differential amplifier 70. Conductor 56-N is coupled by sequentially connected resistors 85, 86, and 87 to the (−) input of amplifier 70. A capacitor 68 is coupled between the junction of resistors 85 in 86 and the junction between resistors 88 and 89. A capacitor 69 is coupled between the junction of resistors 86 and 87 and the junction of resistors 89 and 90. The output 71 of amplifier 70 is coupled by the parallel combination of a feedback resistor RF and a feedback capacitor 72 to the (−) input of amplifier 70. The (+) input of amplifier 70 is connected by the parallel combination of a capacitor 73 and a resistor 91 to the (+) terminal of a voltage source 66 that is referenced to ground.

The right end portion of differential R-2R DAC ladder section 100 is coupled by conductors 55-N and 56-N to the left terminals of switched current source DAC section 53. The bits of switched current source DAC section 53 constitute the most significant the bits, i.e., the MSBs, of bit group converter 3D-1, and the bits of R-2R DAC ladder section 100 constitute the less significant bits , i.e., the LSBs, thereof.

Thus, bit group converter 3D-1 provides a novel combination of an R-2R DAC ladder section 100 and a switched current source DAC section 53 including unit current sources which are shared for dynamic element matching purposes. In general, an R-2R DAC can include a lower bit DAC section formed by R-2R DAC and a higher bit DAC section formed by trimmed switched current sources. Matching between the lower bit section and higher bit sectioned is adjusted by trimming. The required trimming technique is a high-cost manufacturing technique. One known way to solve this cost problem is to use dynamic element matching for all bits, wherein weighting is accomplished by selected combinations of unit value constant current source weighting elements. However, in this conventional dynamic element matching method, the number of unit elements becomes extremely large. For example, $2^n$ elements are needed to provide an n bit converter. Consequently, a high resolution converter implemented with this method requires a large amount of die area, resulting in high chip cost. By combining both types of DAC converters with use of shared unit current sources for dynamic element matching as proposed herein, the number of unit current sources is substantially reduced, resulting in a low cost, high resolution DAC.

Specifically, unit current sources in group 51 (i.e., current sources 64-1, 64-2, 64-3), group 52 (i.e., current sources 77-1, 77-2, 77-3), and group 53 (i.e., current sources 84-1, 84-2, 84-i), all are provided with a unit value of current 1. By changing the combinations of these current sources with switches 63-1, 63-2, 63-3, 76-1, 76-2, 76-3, and 83-1, 83-2, 83-i with predetermined clock timing, the dynamic element matching function is performed. The predetermined combinations of patterns are selected by considering the required level of linearity at the connecting portion between the two DAC sections 100 and 53. Note that in the predetermined combinations of patterns, all of these current sources are utilized for sharing among the three groups 51, 52, and 53, so the grouping as illustrated actually is somewhat meaningless with regard to the unit current source sharing that is used to accomplish the dynamic element matching. Note that the primary purpose of sharing the current sources is to improve the matching by decreasing the discontinuity between the two different DAC sections. The requirement of conversion segment accuracy is more strict for the upper bit section (MSB side) than for the lower bit section (LSB side). The R-2R ladder section with current sources (the lower bit side) has a very good topology for saving die area. There is no need higher accuracy for current sources at the LSB side. Therefore, the needed level linearity must be provided for the current sources "around" the border of the two DAC sections and the MSB side, among groups 51, 52 and 53. Note that providing good matching only between groups 52 and 53 is not sufficient.

The matching between R-2R DAC ladder section 100 and switched current source DAC section 53 must be precise, because otherwise the linearity becomes degraded, causing distortion of $V_{OUT}$. In order to avoid discontinuity between the R-2R sections of R-2R DAC ladder section 100 and switched current source DAC section 53, the additional unit current sources 82-1,2 . . . i and 84-1,2 . . . i (where i can be 16) are provided for the more significant bits of R-2R DAC ladder section 100. Current sources 82-i and 84-i constitute additional current sources. Current sources 84-1 to 84-15 are core elements. Unit current sources 82-16 and 84-16 are additional elements. In the differential configuration of FIG. 14(*a*), current sources at the corresponding opposite side nodes function as additional elements by controlled combinations of switching, and the offset due to these elements can be cancelled out by the differential configuration.

Figure 14B:
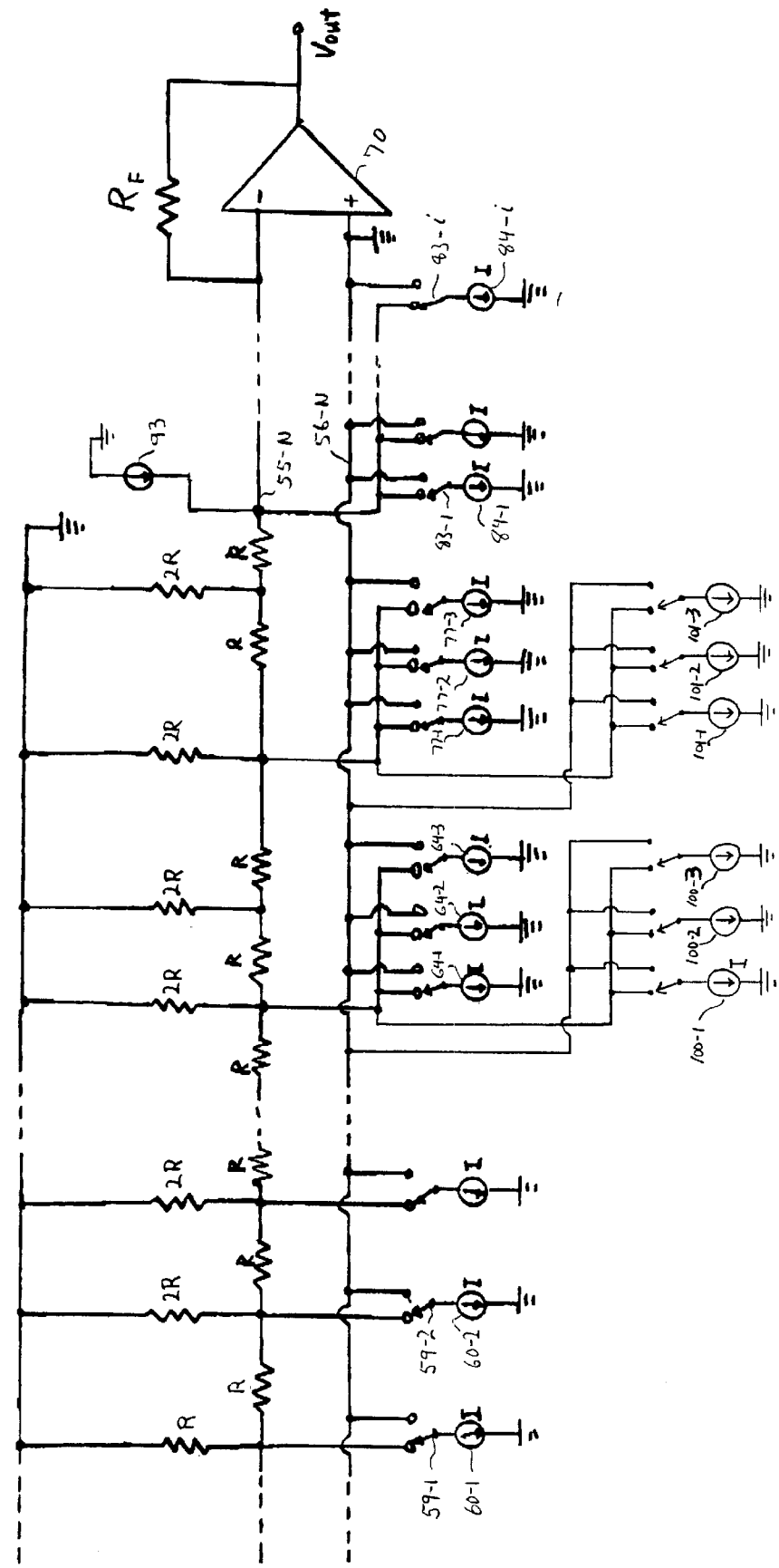
FIG. 14(b) is a detailed schematic diagram of another implementation of the D/A converter D of FIG. 14.

The offset represented in FIG. 16 by the X1 weighting elements for an analog output of zero is accomplished by controlling the current sources 65 and 66 in FIG. 14(*a*), and is essential in order to provide a sufficient number of weighting elements to enable the previously described "randomizing" accomplished by the previously described pattern selector circuitry and bit status signals generator circuitry to be accomplished.

The differential configuration of bit group converter 3D-1 as shown in FIG. 14(*a*) accomplishes automatic cancellation of the above mentioned offset introduced to enable the "randomizing" to be accomplished. (It should be appreciated that the bit group converter could be implemented by using a single-ended digital-to-analog structure similar to the shown in FIG. 14(*a*); such a single-ended structure is shown in FIG. 14(*b*). In FIG. 14(*b*), current sources 100-1, 100-2, 100-3 and 101-1, 101-2, 101-3 are provided as additional current sources with their ON states as default states, and current sources 84-i constitutes an additional current source with its OFF state as its default state. Offset cancellation can be accomplished at any of nodes 55-i (i=1,2, . . . N) by a corresponding value of current source in the 93 as shown in FIG. 14(*b*), which may be equal to 15/16 I.

Figure 15:
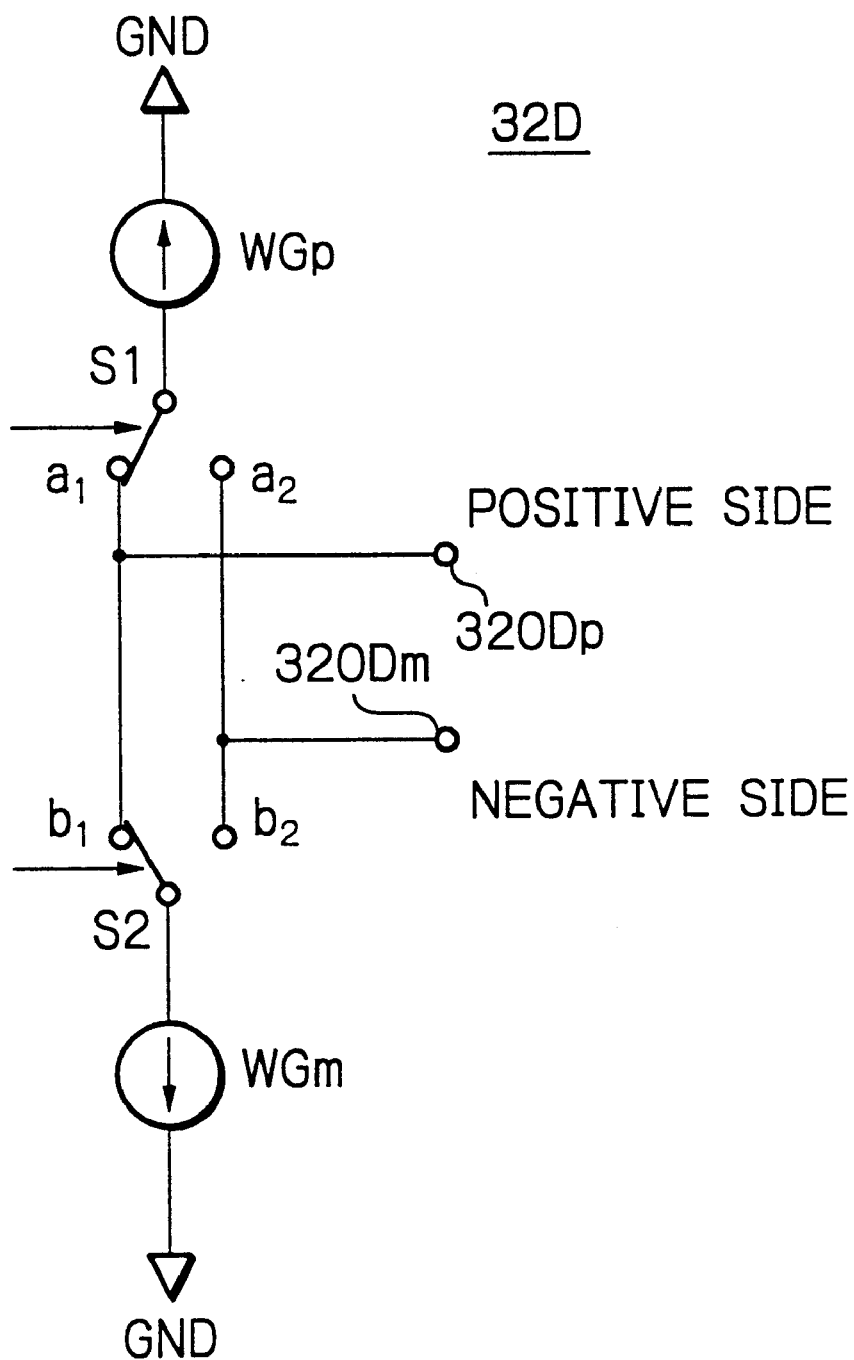
FIG. 15 is a schematic circuit diagram illustrating a sharing circuit 32D for sharing a positive weight generator and a negative weight generator as positive and negative converter outputs for averaging between the positive and negative sides in each of bit group converters 3D-1, 3D-2, . . . , 3D-n for use in the D/A converter D illustrated in FIG. 14.

FIG. 15 illustrates a sharing circuit 32D for sharing a positive weight generator and a negative weight generator as positive and negative converter outputs for averaging between the positive side and the negative side. The illustrated sharing circuit 32D, which is located in each bit group converter, includes a positive weight generator WGp and a negative weight generator WGm having the same weight, and a positive output terminal 320D*p* and a negative output terminal 320D*m* . . . . The positive weight generator WGp is connected between a ground GND and a first switch S1, while the negative weight generator WGm is connected between the ground GND and a second switch S2. These switches, which are controlled by a bit group status signal from the decoder 2D, have first contacts a1, b1 and second contacts a2, b2, respectively. The positive output terminal 320D*p* is connected between the contact a1 and the contact b1, while the negative output terminal 320D*m* is connected between the contact a2 and the contact b2. Though not shown, each switch also includes a neutral contact position which is not connected to either of the output contacts as required. When the switches S1, S2 are changed over to the contacts a1, b1, the respective weight generators can be used to provide the positive converter output. Conversely, when the switches S1, S2 are changed over to the contacts a2, b2, the respective weight generators can be used to provide the negative converter output.

In the D/A converter D including the sharing circuit as described above, the decoder 2D has a similar configuration to that of the decoder 2B in FIG. 5, and comprises a pattern generator 20D and a bit group status signal generation unit 22D. The pattern generator 20D generates averaging patterns as shown in FIGS. 16 and 17. It should be noted that in FIG. 17, weight generators for generating a x4 weight are designated a0–a7, and weight generators for generating a x1 weight are designated b0–b6 since the averaging patterns in FIG. 17 requires the distinction not only between different forms of weight but also among individual weight generators. Averaging patterns shown in FIGS. 16 and 17 represent ±16 expressed levels (=5 bits) in the sign-magnitude format using two forms of weight (x4, x1), in a manner similar to the patterns in FIG. 13. In the illustrated examples, a positive conversion unit 30D*p* includes a total of eight weight generators, and receives a pattern consisting of four left-hand x4 columns (one more generator added to the configuration of FIG. 13, and in FIG. 17, designated as weight generators a4–a7); three left-hand x1 columns (designated as weight generators b4–b6 in FIG. 17); and one right-hand x1 column (corresponding to a sign bit, and designated as a weight generator b0 in FIG. 17). A negative conversion unit 30D*m* includes a total of seven weight generators (one more x4 weight generator added to the configuration of FIG. 13) which receive a pattern consisting of the remaining columns (designated as weight generators a0–a3 and weight generators b1–b3 in FIG. 17). As can be seen from FIG. 16, only two weight generators are added to the upper bit group, as compared with FIG. 13. This results in elimination of the trimming between the weights having different forms of weight. Also, in this example, the same division method and the same division number are employed in both the positive and negative sides. Describing now the averaging patterns in FIG. 16 in greater detail, there are four patterns (1)–(4) as is the case of FIG. 6. As can be seen from FIG. 16, there are no changes in the patterns (1)–(4) at levels 0, 4, 8, 12 and at levels −1, −5, −9, −13. A change from four x1 weights to one x4 weight is found from pattern (3) to pattern (4) at levels 1, 5, 9, 13; from pattern (2) to pattern (3) at levels 2, 6, 10, 14; and from (1) to (2) at levels 3, 7, 11, 15. This change in the averaging pattern is similar to FIG. 6. In addition, a change from one x4 weight to four x1 weights is found from pattern (3) to pattern (4) at levels −2, −6, −10, −14; from pattern (2) to pattern (3) at levels −3, −7, −11, −15; and from pattern (1) to pattern (2) at levels −4, −8, −12, −16. In this way, the averaging is performed over the different forms of weight.

In addition, the averaging is also performed over the positive and negative sides, as shown in FIG. 17. Specifically, at each of levels from "−16" to "15," for the number of weights required to express an input level, a selection of the number of weight generators equal to the number of required weights is "rotated" within available weight generators during a D/A conversion for the input level. For example, the selection of weight generators for input level at "5" will be described below with reference to FIG. 17(*a*). The shown table indicates an exemplary rotation for pattern (1) when the input level is at "5" in FIG. 16. In the rotation for pattern (1) shown in FIG. 17(*a*), there are eight different x4 weight generators available for the selection, and seven different x1 weight generators available for the selection. Then, for the x4 weight generators, the numbers of selected weight generators are shifted five by five in order within the available weight generators. For example, a0–a4 are selected on the first row, and on the second row, shifting by five to the left (in the direction in which the number increases, returning to 0 next to the last number), a5–a7 and, returning to the right end, a0 and a1 are selected. Stated another way, the foregoing combination technique is such that since a0 through a4 are used on the first row, another five weight generators from a5 onward, which are not used in the first row, are used in the second row. Thus, on the third row, the selection is made from a2 onward. Similarly, for x1 weight generators, the numbers of selected weight generators are shifted five by five in order within the available weight generators. For example, b0–b4 are selected on the first row, and on the second row, shifting by five to the left, b5 and b6, and then returning to the right end, b0–b2 are selected. Likewise, those not used in the preceding row are selected. In this way, the averaging can be accomplished between the positive weight generators (a4–a7, b4–b6) and the negative weight generators (a0–a3, b1–b3). While FIG. 17(a) only shows the averaging for pattern (1) in FIG. 16, similar rotation to that of pattern (1) may be applied to the remaining patterns (2)–(4). FIG. 17(a) shows the rotation for pattern (1) when the input level at "5" continues. For the rotation, the period of pattern (1) in FIGS. 8(a)–8(d) may be further divided such that the shown rotation is performed in each of divided sub-periods.

FIG. 17(b) shows the same rotation method as the foregoing when the input level varies. As can be seen from the shown example, the weight generator having the smallest number of those not used in the preceding row, and subsequent weight generators are selected the next time. For example, since weight generators up to a1 are used on the second row of x4 weights at the input level equal to "6," weight generators and onward are used on the third row at the input level equal to "−2." Then, the weight generators a6 and onward are used on the fourth row at the input level equal to "12." It should be noted that in FIG. 17(b), the averaging shown in FIG. 16 is omitted, and pattern (1) in FIG. 16 is only shown.

The bit group status signal generation unit 22D, which receives a plurality of averaging patterns shown in FIGS. 16 and 17, comprises a pattern selector 220D and a bit group status signal generator 222D, as does the bit group status signal generation unit 22B in FIG. 5. The pattern selector 220D selects a pattern from a plurality of averaging patterns. The bit group status signal generator 222D, which receives the selected averaging pattern, generates a bit group status signal for each bit group converter from the received averaging pattern, causing each bit group converter to generate a bit group analog signal. The selection of an averaging pattern can be made in a similar method to that previously described in connection with the D/A converter B in FIG. 5 with reference to FIG. 8. With the D/A converter D, as can be seen from the table of FIG. 16, the analog output delivered from the adder 4D which adds bit group analog signals from the respective bit group converters 3D-1, 3D-2, . . . , 3D-n has an offset formed by four x4 weights and four x1 weights. The offset can be canceled by the offset compensator 5D.

Next, the advantage of the bit division according to the present invention will be described collectively for the D/A converter C (FIG. 12) and the D/A converter D (FIG. 14) with reference to FIGS. 18–21. FIG. 18 shows the relationship among the number of expressed bits, the number of bits in each of divided bit groups, and the number of required weight generating elements for each bit group for the case where the bits representing a digital input signal are divided into two in the D/A converter C according to the bit division method of the present invention, as has been previously shown in FIG. 13. FIG. 21 in turn shows such relationship for the D/A converter D for the case where the bits are divided into two according to the bit division method of the present invention shown in FIG. 16. It should be noted that in FIGS. 18 and 21, the number of upper bits and the number of lower bits only show the number of positive or negative side, so that the total number (indicated in the column "Total") of weight generators is derived by multiplying the number of weight generators on one side by two and adding one (corresponding to a sign bit) to the product. With the division by two, the total number of weight generators required by the D/A converter C (Total C) is expressed by the following equation (5), while the number of weight generators required by the D/A converter D (Total D) is expressed by the following equation (6):

$$\text{Total } C = 2*\{(2^{p1}-1)+(2^{p2}-1)\}+1 \quad (5)$$

$$\text{Total } D = 2*\{2^{p1}+(2^{p2}-1)\}+1 \quad (6)$$

where m is the number of expressed bits, p1 is the number of bits in the upper bit group, and p2 is the number of bits in the lower bit group, as in the aforementioned equations (3) and (4). For purposes of comparison, FIG. 19 shows the number of expressed bits and the total number of weight generators when implemented by the first prior art scheme shown in FIG. 24, and FIG. 20 shows the number of expressed bits and the total number of weight generators when implemented by the second prior art scheme shown in FIG. 25. When compared with the prior art for the number of expressed bits equal to eight bits, the number of weight generators, required in the present invention, is 45 at minimum (approximately one fifth as compared with the prior art shown in FIG. 25) in the division by two configuration. Referring to FIG. 21 for the D/A converter D, on the other hand, the number of required weight generators is 47 at minimum (approximately one fifth as compared with the prior art shown in FIG. 25) in the division by two configuration. Moreover, the number of weight generators required by the D/A converter D is increased only by two from the D/A converter C of FIG. 18, and the additional two weight generators provide for the averaging. While the foregoing relationship is not specifically shown for the division by three or more, the number of required weight generators can be effectively reduced as is the case of the division by two, as can be seen from the example shown in FIG. 10.

While several preferred embodiments of the present invention have been described in detail, the following modifications may be made thereto. In the patterns shown in FIGS. 2, 6 and 13, a plurality of weight generators are provided for each of forms of weight, and each pattern only shows how many weight generators are turned on within the number of weight generators provided therefor. However, like the patterns in FIG. 17 associated with the patterns shown in FIG. 16, the averaging between the weights having the same forms of weight can be added to the shown pattern. For example, in pattern (1) at level 10 in FIG. 6, two right-hand x4 weights and five right-hand x1 weights are selected. Alternatively, the number of required weight generators can be selected in another combination, for example, by shifting the selected weights one to the left to pick up two central x4 weights and five left-hand x1 weights, and so on. By thus "rotating" the selection of weight generators, the averaging between the weights of the same forms of weight can also be implemented. In this case, a period in which each of the averaging patterns (1)–(4) is used is divided into sub-periods such that a pattern resulting from a different selection is used in each of the sub-periods, as is the case of FIG. 17.

According to the digital-to-analog converting method of the present invention described above in detail, a highly accurate digital-to-analog converter can be implemented in a relatively simple configuration by virtue of a reduction in trimmed locations accomplished by the division into bit groups, or the division into bit groups and the use of the averaging patterns. Second, since the division into bit groups and the use of the averaging patterns can reduce the number of weight generators as compared with a required accuracy, a highly accurate digital-to-analog converter can be implemented in a smaller area. Third, since a reduction in trimmed locations accomplished by the division into bit groups results in a reduction in the amount of costly trimming, or since the trimming can be even eliminated by virtue of the division into bit groups and the use of the averaging patterns, a highly accurate digital-to-analog converter can be implemented at a lower cost.

While preferred embodiments of the present invention have been shown and described herein, changes and modifications may be made therein without departing from the spirit and scope of the invention. Therefore, no limitation of the invention is intended other than limitations defined by the appended claims.

What is claimed is:

1. A digital-to-analog converting method for converting a digital signal input comprising a first number of bits each having a different weight from a digital form to an analog form, said method comprising the steps of:

(A) dividing said first number of bits into a second number of bit groups, and using one form of weight for at least one of said bit groups to convert each said bit group into an analog form to generate the second number of bit group analog outputs; and (B) forming an analog signal output representative of said digital signal input from said second number of bit group analog outputs, wherein step (A) includes the steps of
(a) dividing said first number of bits into said second number of bit groups;
(b) selecting said one form of weight for use in expressing each bit group of said second number of bit groups;
(c) determining a number of weights having said selected form of weight required to express each said bit group with said selected form of weight; and
(d) using said selected form of weight and the determined number of weights having said selected form of weight to convert said each bit group to said bit group analog outputs, wherein step (d) includes the steps of
(e) determining a third number of weights as a maximum number of weights having said selected form of weight required to express said each bit group with said selected form of weight;
(f) providing the second number of weight generator groups for said plurality of bit groups by providing a weight generator group comprising said third number of weight generators having a weight corresponding to said selected form of weight for said each bit group; and
(g) controlling said second number of weight generator groups in response to said second number of bit groups to generate said bit group analog outputs, and wherein said third number is equal to a fourth number which is a minimum number of weights having said selected form of weight required for expressing said each bit group with said selected form of weight.

2. A digital-to-analog converting method according to claim 1, wherein the same type of digital-to-analog converting scheme is used for each of said bit groups.

3. A digital-to-analog converting method according to claim 1, wherein said first number of bits do not include a sign bit.

4. A digital-to-analog converting method according to claim 1, wherein said first number of bits includes a sign bit.

5. A digital-to-analog converting method according to claim 1 wherein said second number is equal to or more than two and is smaller than said first number.

6. A digital-to-analog converting method according to claim 1 wherein said plurality of different weight generators comprise voltage or current sources each having a weight corresponding to the weight of each said weight generators.

7. A digital-to-analog converting method according to claim 1 wherein said plurality of different weight generators comprise voltage or current sources having a weight of a common magnitude, and weighting circuitry for applying each said source with a weight of each weight generator.

8. A digital-to-analog converting method according to claim 7 wherein said weighting circuitry comprises an R-2R ladder circuit.

9. The digital-to-analog converting method according to claim 1 further comprising the step of canceling a constant offset in the magnitude of said analog signal output.

10. The digital-to-analog converter according to claim 1 wherein step of dividing includes using one form of weight for each of said bit groups to convert each said bit group into an analog form to generate the second number of bit group analog outputs.

11. The digital-to-analog converter according to claim 1 wherein step of dividing includes using a first form of weight for a first one of said bit groups and using a second form of weight for a second one of said bit groups to convert said first and second bit groups, respectively, into first and second analog forms, respectively, to generate the second number of bit group analog outputs.

12. A digital-to-analog converting method for converting a digital signal input comprising a first number of bits each having a different weight from a digital form to an analog form, said method comprising the steps of:

(A) dividing said first number of bits into a second number of bit groups, and using one form of weight for at least one of said bit groups to convert each said bit group into an analog form to generate the second number of bit group analog outputs; and (B) forming an analog signal output representative of said digital signal input from said second number of bit group analog outputs, wherein said step (A) includes the steps of
(a) dividing said first number of bits into said second number of bit groups;
(b) selecting said one form of weight for use in expressing each bit group of said second number of bit groups;
(c) determining a number of weights having said selected form of weight required to express each said bit group with said selected form of weight; and
(d) using said selected form of weight and the determined number of weights having said selected form of weight to convert said each bit group to said bit group analog outputs, wherein said step (d) includes the steps of
(e) determining a third maximum number of weights having said selected form of weight required to express said each bit group with said selected form of weight;
(f) providing the second number of weight generator groups for said plurality of bit groups by providing a weight generator group comprising said third number of weight generators having a weight corresponding to said selected form of weight for said each bit group; and
(g) controlling said second number of weight generator groups in response to said second number of bit groups to generate said bit group analog outputs, and wherein said third number is the sum of a fourth number which is a minimum number of weights having the selected form of weight required for expressing said each bit group therewith, and a fifth number used for correcting errors between weight generators in said second number of weight generator groups.

13. A digital-to-analog converting method according to claim 12 further comprising the step of selecting, as said selected form of weight for use in expressing said each bit group in said plurality of bit groups, a weight associated with the least significant bit of said each bit group corresponding thereto, or a weight associated with a bit in said first number of bits located at a bit position lower than said least significant bit.

14. A digital-to-analog converting method according to claim 12 wherein said fifth number has a value specific to said each weight generator group.

15. A digital-to-analog converting method according to claim 12 wherein said step (g) includes the steps of:
   (h) preparing a sixth number of different combination patterns of status signals, representing the status of each of all weight generators included in said second number of weight generator groups, for use in an analog expression for each of values represented by said digital signal input, said status signal having a first state for causing an associated weight generator to generate a weighted analog output having a weight of said weight generator, and a second state for causing the associated weight generator to generate a weighted analog output without said weight;
   (i) selecting status signals from said sixth number of different status signal combination patterns within a first period in which a given digital signal input is converted to an analog signal output;
   (j) controlling said all weight generators using said selected status signals to generate said weighted analog outputs from said all weight generators; and
   (k) adding said weighted analog outputs generated from said all weight generators to generate an analog signal output corresponding to said given digital signal input.

16. A digital-to-analog converting method according to claim 15, wherein said step (i) includes selectively using all of said sixth number of different combination patterns of status signals at least once within said first period.

17. A digital-to-analog converting method according to claim 15, wherein said step (i) includes selectively using all of said sixth number of different combination patterns of status signals at least once within a sequence of a plurality of said first periods, and selectively using a portion of said sixth number of different combination patterns of status signals within each first period of the sequence of the plurality of said first periods.

18. A digital-to-analog converter for converting a digital signal input comprising a first number of bits each having a different weight from a digital form to an analog form, said digital-to-analog converter comprising:
   a decoder connected to receive a digital signal input and divide said first number of bits into a second number of bit groups;
   a second number of digital-to-analog converting circuits for converting said second number of bit groups, each said digital-to-analog converting circuit selectively using a form of weight for each said bit group associated therewith, thereby converting said bit group to said analog form in response to said second number of bit groups to generate the second number of bit group analog outputs; and
   an adder for adding said second number of bit group analog outputs to form an analog signal output representative of said digital signal input,
   wherein each said digital-to-analog converting circuit includes a weight generator group having a third number of weight generators having a weight corresponding to said selected form of weight for each said bit group, said third number being a maximum number of weights having said selected form of weight required to express each said bit group therewith, and
   wherein said third number is equal to a fourth number which is a minimum number of weights having said selected form of weight required for expressing said each bit group therewith.

19. A digital-to-analog converter according to claim 18 wherein the same type of digital-to-analog converting scheme is used for said bit groups.

20. A digital-to-analog converter according to claim 18 wherein said first number of bits do not include a sign bit.

21. A digital-to-analog converter according to claim 18 wherein said first number of bits include a sign bit.

22. A digital-to-analog converter according to claim 18 further comprising offset canceling circuitry for canceling a constant offset in the magnitude of said analog signal output.

23. A digital-to-analog converter according to claim 22 wherein said constant offset includes only a constant difference from an analog value represented by said digital signal input in the value of said analog signal output.

24. A digital-to-analog converter according to claim 18 wherein said plurality of different weight generators comprise voltage or current sources each having a weight corresponding to the weight of each said weight generator.

25. A digital-to-analog converter according to claim 18 wherein said plurality of different weight generators comprise voltage or current sources having a weight of a common magnitude, and weighting circuitry for applying each said source with a weight of each weight generator.

26. A digital-to-analog converter according to claim 25 wherein said weighting circuitry comprises an R-2R ladder circuit.

27. A digital-to-analog converter for converting a digital signal input comprising a first number of bits each having a different weight from a digital form to an analog form, said digital-to-analog converter comprising:
   a decoder connected to receive a digital signal input and divide said first number of bits into a second number of bit groups;
   a second number of digital-to-analog converting circuits for converting said second number of bit groups, each said digital-to-analog converting circuit selectively using a form of weight for each said bit group associated therewith, thereby converting said bit group to said analog form in response to said second number of bit groups to generate the second number of bit group analog outputs; and
   an adder for adding said second number of bit group analog outputs to form an analog signal output representative of said digital signal input,
   wherein each said digital-to-analog converting circuit includes a weight generator group having a third number of weight generators having a weight corresponding to said selected form of weight for each said bit group, said third number being a maximum number of weights having said selected form of weight required to express each said bit group therewith, and
   wherein said third number is the sum of a fourth number which is a minimum number of weights having the selected form of weight required for expressing said each bit group therewith, and a fifth number used for correcting errors between weight generators in said second number of weight generator groups.

28. A digital-to-analog converter according to claim 27 wherein as said selected form of weight for use in expressing said each bit group in said plurality of bit groups, a weight associated with the least significant bit of said each bit group corresponding thereto, or a weight associated with a bit in said first number of bits located at a bit position lower than said least significant bit is selected.

29. A digital-to-analog converter according to claim 28 wherein said second number is equal to or more than two and is smaller than said first number.

30. A digital-to-analog converter according to claim 27 wherein said fifth number has a value specific to said each weight generator group.

31. A digital-to-analog converter according to claim 27 wherein said decoder includes pattern generating circuitry for generating a sixth number of different combination patterns of status signals representing the status of all weight generators included in said second number of weight generator groups, for use in an analog expression for each of values represented by said digital signal input, said status signal having a first state for causing an associated weight generator to generate a weighted analog output having a weight of said weight generator, and a second state for causing the associated weight generator to generate a weighted analog output without said weight; and status signal selecting circuitry for selecting status signals from said sixth number of different status signal combination patterns within a first period in which a given digital signal input is converted to an analog signal output, said status signal selecting circuitry using said selected status signals to control said all weight generators to generate said weighted analog outputs from all of said weight generators.

32. A digital-to-analog converter according to claim 31 wherein said status signal selecting circuitry selects and uses the status signals of all of said sixth number of different combination patterns at least once within said first period.

33. A digital-to-analog converter according to claim 31 wherein said status signal selecting circuitry selects and uses the status signals of all of said sixth number of different combination patterns of status signals at least once within a sequence of a plurality of said first periods, and selects and uses a portion of said sixth number of different combination patterns of status signals within each first period of the sequence of the plurality of said first periods.

34. A sign-magnitude type digital-to-analog converter for converting a digital signal input from a digital form to an analog form, said digital signal input comprised of a sign bit representative of a sign, and a first number of bits each representative of a magnitude, said bits having different weights from each other, said digital-to-analog converter comprising:

a decoder connected to receive a digital signal input for dividing said first number of bits into a second number of bit groups;

a second number of positive bit group digital-to-analog converting circuits for said second number of bit groups for use when said sign bit indicates positive, each said positive bit group digital-to-analog converting circuit selecting and using a form of weight for each said bit group associated therewith, thereby converting said second number of bit groups to said analog form in response to said second number of bit groups to generate the second number of positive bit group analog outputs;

a second number of negative bit group digital-to-analog converting circuits for said second number of bit groups for use when said sign bit does not indicate positive, each said negative bit group digital-to-analog converting circuit selecting and using a form of weight for each said bit group associated therewith, thereby converting said second number of bit groups to said analog form in response to said second number of bit groups to generate the second number of negative bit group analog outputs; and an adder for adding said second number of positive bit group analog outputs and said second number of negative bit group analog outputs to form an analog signal output representative of said digital signal input, wherein as said selected form of weight for use in expressing said each bit group in said plurality of bit groups, a weight associated with the least significant bit of said each bit group corresponding thereto, or a weight associated with a bit in said first number of bits located at a bit position lower than said least significant bit is selected.

35. A digital-to-analog converter according to claim 34 wherein the same type of digital-to-analog converting scheme is used for said bit groups.

36. A digital-to-analog converter according to claim 34 further comprising:

sign bit converting circuitry provided for said sign bit for selecting and using a form of weight for said sign bit to convert said sign bit to said analog form in response to said sign bit, thereby generating a sign bit analog output, wherein said adder adds said sign bit analog output to said second number of positive bit group analog outputs and said second number of negative bit group analog outputs to form said analog signal output.

37. A digital-to-analog converter according to claim 34 wherein each said bit group digital-to-analog converting circuit includes a weight generator group having a third number of weight generators having a weight corresponding to said selected form of weight for each said bit group, said third number being a maximum number of weights having said selected form of weight required to express each said bit group with said selected form of weight.

38. A digital-to-analog converter according to claim 34 wherein said second number is equal to or more than two and is smaller than said first number.

39. A digital-to-analog converter according to claim 34 wherein said second number has the same value for said positive bit group digital-to-analog converting circuit and said negative bit group digital-to-analog converting circuit.

40. A digital-to-analog converter according to claim 34 wherein said second number has a different value in between said positive bit group digital-to-analog converting circuit and said negative bit group digital-to-analog converting circuit.

41. The digital-to-analog converter according to claim 34 further comprising offset canceling circuitry for canceling a constant offset in the magnitude of said analog signal output.

42. A sign-magnitude type digital-to-analog converter for converting a digital signal input from a digital form to an analog form, said digital signal input comprised of a sign bit representative of a sign, and a first number of bits each representative of a magnitude, said bits having different weights from each other, said digital-to-analog converter comprising:

a decoder connected to receive a digital signal input for dividing said first number of bits into a second number of bit groups;

a second number of positive bit group digital-to-analog converting circuits for said second number of bit groups for use when said sign bit indicates positive, each said positive bit group digital-to-analog converting circuit selecting and using a form of weight for each said bit group associated therewith, thereby converting said second number of bit groups to said analog form in response to said second number of bit groups to generate the second number of positive bit group analog outputs;

a second number of negative bit group digital-to-analog converting circuits for said second number of bit groups for use when said sign bit does not indicate positive, each said negative bit group digital-to-analog converting circuit selecting and using a form of weight for each said bit group associated therewith, thereby converting said second number of bit groups to said analog form in response to said second number of bit groups to generate the second number of negative bit group analog outputs; and an adder for adding said second number of positive bit group analog outputs and said second number of negative bit group analog outputs to form an analog signal output representative of said digital signal input, wherein each said bit group digital-to-analog converting circuit includes a weight generator group having a third number of weight generators having a weight corresponding to said selected form of weight for each said bit group, said third number being a maximum number of weights having said selected form of weight required to express each said bit group with said selected form of weight, and wherein said third number is equal to a fourth number which is a minimum number of weights having said selected form of weight required for expressing said each bit group therewith.

43. The digital-to-analog converter according to claim 42 further comprising offset canceling circuitry for canceling a constant offset in the magnitude of said analog signal output.

44. A sign-magnitude type digital-to-analog converter for converting a digital signal input from a digital form to an analog form, said digital signal input comprised of a sign bit representative of a sign, and a first number of bits each representative of a magnitude, said bits having different weights from each other, said digital-to-analog converter comprising:

a decoder connected to receive a digital signal input for dividing said first number of bits into a second number of bit groups;

a second number of positive bit group digital-to-analog converting circuits for said second number of bit groups for use when said sign bit indicates positive, each said positive bit group digital-to-analog converting circuit selecting and using a form of weight for each said bit group associated therewith, thereby converting said second number of bit groups to said analog form in response to said second number of bit groups to generate the second number of positive bit group analog outputs;

a second number of negative bit group digital-to-analog converting circuits for said second number of bit groups for use when said sign bit does not indicate positive, each said negative bit group digital-to-analog converting circuit selecting and using a form of weight for each said bit group associated therewith, thereby converting said second number of bit groups to said analog form in response to said second number of bit groups to generate the second number of negative bit group analog outputs; and an adder for adding said second number of positive bit group analog outputs and said second number of negative bit group analog outputs to form an analog signal output representative of said digital signal input, wherein each said bit group digital-to-analog converting circuit includes a weight generator group having a third number of weight generators having a weight corresponding to said selected form of weight for each said bit group, said third number being a maximum number of weights having said selected form of weight required to express each said bit group with said selected form of weight, and wherein said third number is the sum of a fourth number which is a minimum number of weights having the selected form of weight required for expressing said each bit group therewith, and a fifth number used for correcting errors between weight generators in said second number of weight generator groups.

45. A digital-to-analog converter according to claim 44, wherein said fifth number has a value specific to said each weight generator group.

46. A digital-to-analog converter according to claim 44 wherein said decoder includes pattern generating circuitry for generating a sixth number of different combination patterns of status signals representing the status of all of said weight generators, for use in an analog expression for each of values represented by said digital signal input, said status signal having a first state for causing an associated weight generator to generate a weighted analog output having a weight of said weight generator, and a second state for causing the associated weight generator to generate a weighted analog output without said weight; and status signal selecting circuitry for selecting status signals from said sixth number of different status signal combination patterns within a first period in which a given digital signal input is converted to an analog signal output, said status signal selecting circuitry using said selected status signals to control said all weight generators to generate said weighted analog outputs from said all weight generators.

47. A digital-to-analog converter according to claim 46 wherein said status signal selecting circuitry selects and uses the status signals of all of said six number of different combination patterns at least once within said first period.

48. A digital-to-analog converter according to claim 44 wherein said decoder includes for each of said second number of positive weight generator groups and said second number of negative weight generator groups:

pattern generating circuitry for generating a sixth number of different combination patterns of status signals representing the status of said second number of weight generators, for use in an analog expression for each of values represented by said digital signal input, said status signal having a first state for causing an associated weight generator to generate a weighted analog output having a weight of said weight generator, and a second state for causing the associated weight generator to generate a weighted analog output without said weight; and status signal selecting circuitry for selecting status signals from said sixth number of different status signal combination patterns within a first period in which a given digital signal input is converted to an analog signal output, said status signal selecting circuitry using said selected status signals to control said all weight generators to generate said weighted analog outputs from said all weight generators.

49. A digital-to-analog converter according to claim 46 wherein said status signal selecting circuitry selects and uses the status signals of all of said six number of different combination patterns at least once within a sequence of a plurality of said first periods, and selects and uses a portion of said six number of different combination patterns within each first period of said sequence of a plurality of said first periods.

50. A sign-magnitude type digital-to-analog converter for converting a digital signal input from a digital form to an analog form, said digital signal input comprised of a sign bit representative of a sign, and a first number of bits each representative of a magnitude, said bits having different weights from each other, said digital-to-analog converter comprising:
- a decoder connected to receive a digital signal input for dividing said first number of bits into a second number of bit groups;
- a second n umber of positive bit group digital-to-analog converting circuits for said second number of bit groups for use when said sign bit indicates positive, each said positive bit group digital-to-analog converting circuit selecting and using a form of weight for each said bit group associated therewith, thereby converting said second number of bit groups to said analog form in response to said second number of bit groups to generate the second number of positive bit group analog outputs;
- a second number of negative bit group digital-to-analog converting circuits for said second number of bit groups for use when said sign bit does not;indicate positive, each said negative bit group digital-to-analog converting circuit selecting and using a form of weight for each said bit group associated therewith, thereby converting said second number of bit groups to said analog form in response to said second number of bit groups to generate the second number of negative bit group analog outputs;
- an adder for adding said second number of positive bit group analog outputs and said second number of negative bit group analog outputs to form an analog signal output representative of said digital signal input; and
- offset canceling circuitry for canceling a constant offset in the magnitude of said analog signal output.

51. A digital-to-analog converter according to claim 50 wherein said constant offset includes only a constant difference from an analog value represented by said digital signal input in the value of said analog signal output.

52. A sign-magnitude type digital-to-analog converter for converting a digital signal input from a digital form to an analog form, said digital signal input comprised of a sign bit representative of a sign, and a first number of bits each representative of a magnitude, said bits having different weights from each other, said digital-to-analog converter comprising:
- a decoder connected to receive a digital signal input for dividing said first number of bits into a second number of bit groups;
- a second number of positive bit group digital-to-analog converting circuits for said second number of bit groups for use when said sign bit indicates positive, each said positive bit group digital-to-analog converting circuit selecting and using a form of weight for each said bit group associated therewith, thereby converting said second number of bit groups to said analog form in response to said second number of bit groups to generate the second number of positive bit group analog outputs;
- a second number of negative bit group digital-to-analog converting circuits for said second number of bit groups for use when said sign bit does not indicate positive, each said negative bit group digital-to-analog converting circuit selecting and using a form of weight for each said bit group associated therewith, thereby converting said second number of bit groups to said analog form in response to said second number of bit groups to generate the second number of negative bit group analog outputs; and
- an adder for adding said second number of positive bit group analog outputs and said second number of negative bit group analog outputs to form an analog signal output representative of said digital signal input,
- wherein each said bit group digital-to-analog converting circuit includes a weight generator group having a third number of weight generators having a weight corresponding to said selected form of weight for each said bit group, said third number being a maximum number of weights having said selected form of weight required to express each said bit group with said selected form of weight, and
- wherein said plurality of different weight generators comprise voltage or current sources each having a weight corresponding to the weight of each said weight generator.

53. A sign-magnitude type digital-to-analog converter for converting a digital signal input from a digital form to an analog form, said digital signal input comprised of a sign bit representative of a sign, and a first number of bits each representative of a magnitude, said bits having different weights from each other, said digital-to-analog converter comprising:
- a decoder connected to receive a digital signal input for dividing said first number of bits into a second number of bit groups;
- a second number of positive bit group digital-to-analog converting circuits for said second number of bit groups for use when said sign bit indicates positive, each said positive bit group digital-to-analog converting circuit selecting and using a form of weight for each said bit group associated therewith, thereby converting said second number of bit groups to said analog form in response to said second number of bit groups to generate the second number of positive bit group analog outputs;
- a second number of negative bit group digital-to-analog converting circuits for said second number of bit groups for use when said sign bit does not indicate positive, each said negative bit group digital-to-analog converting circuit selecting and using a form of weight for each said bit group associated therewith, thereby converting said second number of bit groups to said analog form in response to said second number of bit groups to generate the second number of negative bit group analog outputs; and
- an adder for adding said second number of positive bit group analog outputs and said second number of negative bit group analog outputs to form an analog signal output representative of said digital signal input,
- wherein each said bit group digital-to-analog converting circuit includes a weight generator group having a third number of weight generators having a weight corresponding to said selected form of weight for each said bit group, said third number being a maximum number of weights having said selected form of weight required to express each said bit group with said selected form of weight, and anything of wherein said plurality of different weight generators comprise voltage or current sources having a weight of a common magnitude, and weighting circuitry for applying each said source with a weight of each weight generator.

54. A digital-to-analog converter according to claim 53 wherein said weighting circuitry comprises an R-2R ladder circuit.

55. A digital-to-analog converter according to claim 54 herein said weighting circuitry further includes switched current source digital-to-analog converting circuitry coupled to said R-2R ladder circuit to form a composite digital-to-analog circuit wherein the most significant bits of the digital-to-analog converter are included in the switched current source digital-to-analog circuitry.

56. A digital-to-analog converter according to claim 55 wherein the R-2R ladder circuit includes a plurality of switched unit current sources coupled to corresponding node conductors between R and 2R legs, respectively, of the R-2R ladder circuit to provide equivalent bit values of the corresponding node conductors.

57. A digital-to-analog converter according to claim 56 including a first group of switched unit current sources, the first group including a first predetermined number of switched unit current sources coupled to a first node between an R leg and a 2R leg of the R-2R ladder circuit to establish a constant offset in the value of said analog signal output.

58. A digital-to-analog converter according to claim 57 wherein the R-2R ladder circuit is a differential R-2R ladder circuit including a number, equal to the first predetermined number, of switched unit current sources coupled to a second node between an R leg and a 2R leg of a first section of the differential R-2R ladder circuit, the first node being in a second section of the differential R-2R ladder circuit, the first node corresponding to the second node.

59. A digital-to-analog converter according to claim 57, wherein the switched current source digital-to-analog converting circuitry includes a second group of switched unit current sources including a second predetermined number of unit current sources, and wherein some or all of the switched unit current sources of the first and second groups are dynamically shared between the first and second groups.

* * * * *